(12) United States Patent
Venkatadri et al.

(10) Patent No.: US 11,664,340 B2
(45) Date of Patent: May 30, 2023

(54) NEGATIVE FILLET FOR MOUNTING AN INTEGRATED DEVICE DIE TO A CARRIER

(71) Applicant: Analog Devices, Inc., Norwood, MA (US)

(72) Inventors: Vikram Venkatadri, Ayer, MA (US); David Frank Bolognia, Charlestown, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/927,853

(22) Filed: Jul. 13, 2020

(65) Prior Publication Data
US 2022/0013490 A1   Jan. 13, 2022

(51) Int. Cl.
*H01L 23/31* (2006.01)
*H01L 23/00* (2006.01)

(52) U.S. Cl.
CPC .......... *H01L 24/32* (2013.01); *H01L 23/3157* (2013.01); *H01L 24/73* (2013.01); *H01L 24/92* (2013.01); *H01L 2224/26175* (2013.01); *H01L 2224/32225* (2013.01); *H01L 2224/73204* (2013.01); *H01L 2224/92125* (2013.01)

(58) Field of Classification Search
CPC ...... H01L 24/32; H01L 23/3157; H01L 24/73
See application file for complete search history.

(56) References Cited

U.S. PATENT DOCUMENTS

| | | | |
|---|---|---|---|
| 3,553,030 A | 1/1971 | Lebrun | |
| 4,883,967 A | 11/1989 | Tsutsui et al. | |

(Continued)

FOREIGN PATENT DOCUMENTS

| | | |
|---|---|---|
| CN | 101395715 A | 3/2009 |
| CN | 103253627 A | 8/2013 |

(Continued)

OTHER PUBLICATIONS

"Micromachining—Function in a Small Package", SSC00-X-3, to Fox et al., p. 1-7, available at http://digitalcommons.usu.edu/cgi/viewcontent.cgi?article=2100&context=smallsat.

(Continued)

*Primary Examiner* — Errol V Fernandes
(74) *Attorney, Agent, or Firm* — Knobbe, Martens, Olson & Bear LLP

(57) ABSTRACT

An electronic module is disclosed. The electronic module can include a package substrate, an integrated device die, a dam structure, and a mounting compound. The integrated device die can have an upper side, a lower side, and an outer side edge. The dam structure can have a first sidewall and a second sidewall opposite the first sidewall. The second sidewall can be nearer to the outer side edge than the first sidewall. The first sidewall can be laterally positioned between a center of the lower side of the integrated device die and the outer side edge. The dam structure can be disposed between a portion of the package substrate and a portion of the lower side of the integrated device die. The mounting compound can be disposed between the lower side of the integrated device die and the package substrate. The dam structure can be positioned between the mounting compound and the outer side edge of the integrated device die.

20 Claims, 14 Drawing Sheets

(56) References Cited

U.S. PATENT DOCUMENTS

| | | |
|---|---|---|
| 5,487,098 A | 1/1996 | Dobbs |
| 5,528,043 A | 6/1996 | Spivey et al. |
| 5,627,407 A | 5/1997 | Suhir et al. |
| 5,801,385 A | 9/1998 | Endo et al. |
| 5,834,848 A | 11/1998 | Iwasaki |
| 5,889,313 A | 3/1999 | Parker |
| 6,084,308 A | 7/2000 | Kelkar et al. |
| 6,166,434 A | 12/2000 | Desai et al. |
| 6,184,064 B1 | 2/2001 | Jiang et al. |
| 6,300,679 B1 | 10/2001 | Mukerji et al. |
| 6,323,891 B1 | 11/2001 | Kitani et al. |
| 6,396,898 B1 | 5/2002 | Saito et al. |
| 6,426,991 B1 | 7/2002 | Mattson et al. |
| 6,476,417 B2 | 11/2002 | Honda et al. |
| 6,510,195 B1 | 1/2003 | Chappo et al. |
| 6,573,506 B2 | 6/2003 | Sato et al. |
| 6,601,947 B1 | 8/2003 | Sato et al. |
| 6,667,480 B2 | 12/2003 | Kajiwara et al. |
| 6,689,640 B1 | 2/2004 | Mostafazadeh et al. |
| 6,759,745 B2 | 7/2004 | Masumoto et al. |
| 6,768,196 B2 | 7/2004 | Harney et al. |
| 6,825,572 B2 | 11/2004 | Tian et al. |
| 7,022,546 B2 | 4/2006 | Spooner et al. |
| 7,067,817 B2 | 6/2006 | Suganuma et al. |
| 7,122,893 B2 | 10/2006 | Weng et al. |
| 7,148,084 B2 | 12/2006 | Strobel et al. |
| 7,166,911 B2 | 1/2007 | Karpman et al. |
| 7,189,971 B2 | 3/2007 | Spartiotis |
| 7,193,218 B2 | 3/2007 | Nagano |
| 7,202,482 B2 | 4/2007 | Yokoi |
| 7,227,245 B1 | 6/2007 | Bayan et al. |
| 7,339,176 B2 | 3/2008 | El-Hanany |
| 7,358,501 B2 | 4/2008 | Danzer et al. |
| 7,382,043 B2 | 6/2008 | Longden et al. |
| 7,468,514 B1 | 12/2008 | Suzuki et al. |
| 7,504,637 B2 | 3/2009 | Thorne |
| 7,504,701 B2 | 3/2009 | Moribayashi et al. |
| 7,544,947 B2 | 6/2009 | Kerwin et al. |
| 7,586,178 B2 | 9/2009 | Manatad |
| 7,615,853 B2 | 11/2009 | Shen et al. |
| 7,691,726 B2 | 4/2010 | Seng |
| 7,696,610 B2 | 4/2010 | Patterson |
| 7,795,725 B2 | 9/2010 | Mouli et al. |
| 7,812,440 B2 | 10/2010 | Yamazaki et al. |
| 7,892,890 B2 | 2/2011 | Kurosawa |
| 7,893,546 B2 | 2/2011 | Zhao et al. |
| 7,939,916 B2 | 5/2011 | O'Donnell et al. |
| 8,000,437 B2 | 8/2011 | Kotooka |
| 8,324,729 B2 | 12/2012 | Gupta et al. |
| 8,344,487 B2 | 1/2013 | Zhang et al. |
| 8,350,383 B2 | 1/2013 | Daubenspeck et al. |
| 8,569,861 B2 | 10/2013 | O'Donnell et al. |
| 8,704,364 B2 | 4/2014 | Banijamali |
| 8,791,532 B2 | 7/2014 | Graf et al. |
| 8,828,806 B2 | 9/2014 | Sumita |
| 8,829,454 B2 | 9/2014 | Bolognia |
| 8,859,975 B2 | 10/2014 | Tokura et al. |
| 8,866,098 B2 | 10/2014 | Hayatsu et al. |
| 9,035,457 B2 | 5/2015 | Lin et al. |
| 9,116,022 B2 | 8/2015 | Bolognia |
| 9,171,878 B2 | 10/2015 | Yaoi et al. |
| 9,324,687 B1 | 4/2016 | Kelkar et al. |
| 9,343,367 B2 | 5/2016 | Goida et al. |
| 9,466,594 B2 | 10/2016 | Bolognia |
| 9,583,472 B2 | 2/2017 | Chung et al. |
| 9,698,127 B2 | 7/2017 | Goida et al. |
| 9,835,733 B2 | 12/2017 | Ying |
| 9,837,352 B2 | 12/2017 | Chang et al. |
| 10,217,649 B2 | 2/2019 | Lai et al. |
| 10,276,525 B2 | 4/2019 | Hsiao et al. |
| 10,287,161 B2 | 5/2019 | Xue et al. |
| 10,340,302 B2 | 7/2019 | Bologna et al. |
| 10,586,716 B2 | 3/2020 | Lu et al. |
| 11,056,455 B2 | 7/2021 | Venkatadri et al. |
| 2002/0011572 A1 | 1/2002 | Kajiwara et al. |
| 2002/0070343 A1 | 6/2002 | Hoffman |
| 2002/0079445 A1 | 6/2002 | Hantschel et al. |
| 2002/0125550 A1 | 9/2002 | Estacio |
| 2002/0148968 A1 | 10/2002 | Der Haar |
| 2002/0153492 A1 | 10/2002 | Sekine et al. |
| 2003/0010924 A1 | 1/2003 | El-Hanany et al. |
| 2003/0025183 A1 | 2/2003 | Thornton et al. |
| 2003/0025199 A1 | 2/2003 | Wu et al. |
| 2003/0097875 A1 | 5/2003 | Lentz et al. |
| 2003/0111720 A1 | 6/2003 | Tan et al. |
| 2004/0041248 A1 | 3/2004 | Harney et al. |
| 2004/0223583 A1 | 11/2004 | Tsujii |
| 2005/0029463 A1 | 2/2005 | Kaemmerer |
| 2005/0051885 A1 | 3/2005 | Weng et al. |
| 2005/0067178 A1 | 3/2005 | Pearson et al. |
| 2005/0093174 A1 | 5/2005 | Seng |
| 2005/0280141 A1 | 12/2005 | Zhang |
| 2005/0285973 A1 | 12/2005 | Singh et al. |
| 2006/0020319 A1 | 1/2006 | Swee |
| 2006/0223227 A1 | 10/2006 | Kubota et al. |
| 2007/0045556 A1 | 3/2007 | Watanabe et al. |
| 2007/0066139 A1 | 3/2007 | Roeper et al. |
| 2007/0075404 A1 | 4/2007 | Dimaano |
| 2007/0096249 A1 | 5/2007 | Roeper et al. |
| 2007/0152148 A1 | 7/2007 | Chao et al. |
| 2007/0152314 A1 | 7/2007 | Manepalli et al. |
| 2007/0183184 A1 | 8/2007 | Nakamura et al. |
| 2007/0205792 A1 | 9/2007 | Mouli et al. |
| 2007/0221859 A1 | 9/2007 | Nakata |
| 2008/0011959 A1 | 1/2008 | Thorne |
| 2008/0100732 A1 | 5/2008 | Minamio et al. |
| 2008/0112150 A1 | 5/2008 | Jones |
| 2008/0197480 A1 | 8/2008 | Yang et al. |
| 2008/0203566 A1 | 8/2008 | Su |
| 2008/0217761 A1 | 9/2008 | Yang et al. |
| 2008/0283764 A1 | 11/2008 | Kerwin |
| 2009/0065921 A1 | 3/2009 | Yamazaki et al. |
| 2009/0084971 A1 | 4/2009 | Ohta et al. |
| 2009/0096112 A1 | 4/2009 | Jeon et al. |
| 2009/0121146 A1 | 5/2009 | Luhta et al. |
| 2009/0147479 A1 | 6/2009 | Mori et al. |
| 2009/0200065 A1 | 8/2009 | Otoshi et al. |
| 2010/0078565 A1 | 4/2010 | Tsubota et al. |
| 2010/0078791 A1* | 4/2010 | Yim .................. H01L 25/0655 257/686 |
| 2010/0224785 A1 | 9/2010 | Chiyoma et al. |
| 2010/0276572 A1 | 11/2010 | Iwabuchi et al. |
| 2011/0024888 A1 | 2/2011 | Pagaila et al. |
| 2011/0074037 A1 | 3/2011 | Takeshima et al. |
| 2011/0133939 A1 | 6/2011 | Ranganathan et al. |
| 2011/0260338 A1 | 10/2011 | Lee et al. |
| 2011/0272588 A1 | 11/2011 | Jadrich et al. |
| 2011/0304015 A1 | 12/2011 | Kim et al. |
| 2011/0309491 A1 | 12/2011 | Thorne et al. |
| 2012/0080764 A1 | 4/2012 | Xue et al. |
| 2012/0097857 A1 | 4/2012 | Hayatsu et al. |
| 2012/0098121 A1 | 4/2012 | Chen et al. |
| 2012/0119388 A1 | 5/2012 | Cho et al. |
| 2012/0126381 A1 | 5/2012 | Uenda et al. |
| 2012/0267731 A1* | 10/2012 | Graf .................. G01N 27/128 257/415 |
| 2014/0027637 A1 | 1/2014 | Watano |
| 2014/0091461 A1 | 4/2014 | Shen |
| 2014/0103501 A1 | 4/2014 | Chen et al. |
| 2014/0159226 A1 | 6/2014 | Bolognia |
| 2014/0175674 A1 | 6/2014 | Chen |
| 2015/0061043 A1 | 3/2015 | Bolognia |
| 2015/0181697 A1 | 6/2015 | Goida et al. |
| 2015/0340327 A1 | 11/2015 | Uzoh |
| 2016/0093796 A1 | 3/2016 | Arai et al. |
| 2016/0181169 A1 | 6/2016 | Huang et al. |
| 2016/0293575 A1 | 10/2016 | Liu et al. |
| 2016/0320495 A1 | 11/2016 | Ying et al. |
| 2016/0322300 A1 | 11/2016 | Song et al. |
| 2016/0322418 A1 | 11/2016 | Leblans et al. |
| 2016/0322562 A1 | 11/2016 | Jang et al. |
| 2016/0336297 A1 | 11/2016 | Goida et al. |
| 2017/0022051 A1 | 1/2017 | Xue et al. |
| 2017/0084521 A1 | 3/2017 | Chang et al. |

(56) References Cited

U.S. PATENT DOCUMENTS

| | | |
|---|---|---|
| 2017/0186719 A1 | 6/2017 | Kira et al. |
| 2017/0188458 A1 | 6/2017 | Hsieh et al. |
| 2017/0230597 A1 | 8/2017 | Fahim et al. |
| 2017/0258422 A1 | 9/2017 | Kim et al. |
| 2017/0287849 A1 | 10/2017 | Takaku |
| 2017/0307766 A1 | 10/2017 | Abenaim et al. |
| 2018/0019035 A1 | 1/2018 | Baturin |
| 2018/0100937 A1 | 4/2018 | Luhta et al. |
| 2018/0102312 A1 | 4/2018 | Pun |
| 2018/0102470 A1 | 4/2018 | Das et al. |
| 2018/0210096 A1 | 7/2018 | Luhta et al. |
| 2019/0043823 A1 | 2/2019 | Venkatadri et al. |
| 2019/0067034 A1 | 2/2019 | Pachamuthu et al. |
| 2019/0088636 A1 | 3/2019 | Gamini |
| 2019/0305792 A1 | 10/2019 | Hasegawa |
| 2019/0363226 A1 | 11/2019 | Musashi et al. |
| 2020/0027803 A1 | 1/2020 | Lu et al. |
| 2020/0035578 A1 | 1/2020 | Wu et al. |
| 2020/0185346 A1 | 6/2020 | Venkatadri et al. |
| 2020/0185450 A1 | 6/2020 | Venkatadri |
| 2020/0185646 A1 | 6/2020 | Kim |

FOREIGN PATENT DOCUMENTS

| | | |
|---|---|---|
| CN | 206236671 | 6/2017 |
| CN | 109326567 A | 2/2019 |
| CN | 109346539 A | 2/2019 |
| CN | 106373946 | 2/2020 |
| DE | 202016103918 | 12/2016 |
| DE | 102016111931 | 10/2020 |
| EP | 1852716 A3 | 11/2007 |
| EP | 2819580 | 1/2015 |
| EP | 2947692 | 9/2020 |
| JP | H02-78234 | 3/1990 |
| JP | 06-260723 | 9/1994 |
| JP | H07-302772 | 11/1995 |
| JP | 10-284633 | 10/1998 |
| JP | 2001-099942 | 4/2001 |
| JP | 2001-338932 A | 12/2001 |
| JP | 2002-022841 | 1/2002 |
| JP | 2002-134439 | 5/2002 |
| JP | 2006-052978 | 2/2006 |
| JP | 2006-351765 | 12/2006 |
| JP | 2008-171881 | 7/2008 |
| JP | 2008-268038 | 11/2008 |
| JP | 2009-189384 | 8/2009 |
| JP | 2010-021251 A | 1/2010 |
| JP | 2010-034519 A | 2/2010 |
| JP | 2010-278220 A | 12/2010 |
| JP | 2012-088152 | 5/2012 |
| JP | 2014-011665 A | 1/2014 |
| JP | 2014-035293 A | 2/2014 |
| JP | 2014-056954 A | 3/2014 |
| JP | 2017-120800 A | 7/2014 |
| JP | 6471122 | 2/2019 |
| JP | 6745846 | 2/2019 |
| WO | WO 2007/039840 A1 | 4/2007 |
| WO | WO 2007/102358 A1 | 9/2007 |
| WO | WO 2008/091840 | 7/2008 |
| WO | WO 2009/066556 A1 | 5/2009 |
| WO | WO 2007/102358 | 7/2009 |
| WO | WO 2010/039855 | 4/2010 |
| WO | WO 2010/137396 | 12/2010 |
| WO | WO 2015/138359 | 9/2015 |
| WO | WO 2015/179764 | 11/2015 |
| WO | WO 2016/048367 | 3/2016 |
| WO | WO 2018/182754 | 10/2018 |
| WO | WO 2022/015637 | 1/2022 |

OTHER PUBLICATIONS

Cesmeli, Erdogan Ph.D., "V-Res—Detecting the Difference in vol. CT," GE Healthcare Publication.

Huai-Hui et al., "Fracture analysis on die attach adhesives for stacked packages based on in-situ testing and cohesive zone model", Microelectronics Reliability, 53:1021-1028 (Jul. 2013).

Maloney, Lawrence D., "Close Cooperation Among A Global Engineering Team Led to the Success of the Lightspeed VCT Medical Scanner," Test & Measurement World Aug. 2005.

Yang, "Underfill viscous flow between parallel plates and solder bump", IEEE Transactions on Components and Packaging Technologies, 25(4):695-700 (Dec. 2002).

Zhang et al., "Recent Advances in Flip-Chip Underfill: Materials, Process, and Reliability", IEEE Transactions on Advanced Packaging, 27(3):515-524 (Aug. 2004).

Bellenger et al., "Silicon interposers with integrated passive devices: Ultra-miniaturized solution using 2.5D packaging platform," IPDIA, accessed Sep. 10, 2019.

Written Opinion issued in application No. PCT/US2021/041251 dated Nov. 2, 2021.

International Search Report issued in application No. PCT/US2021/041251 dated Nov. 2, 2021.

\* cited by examiner

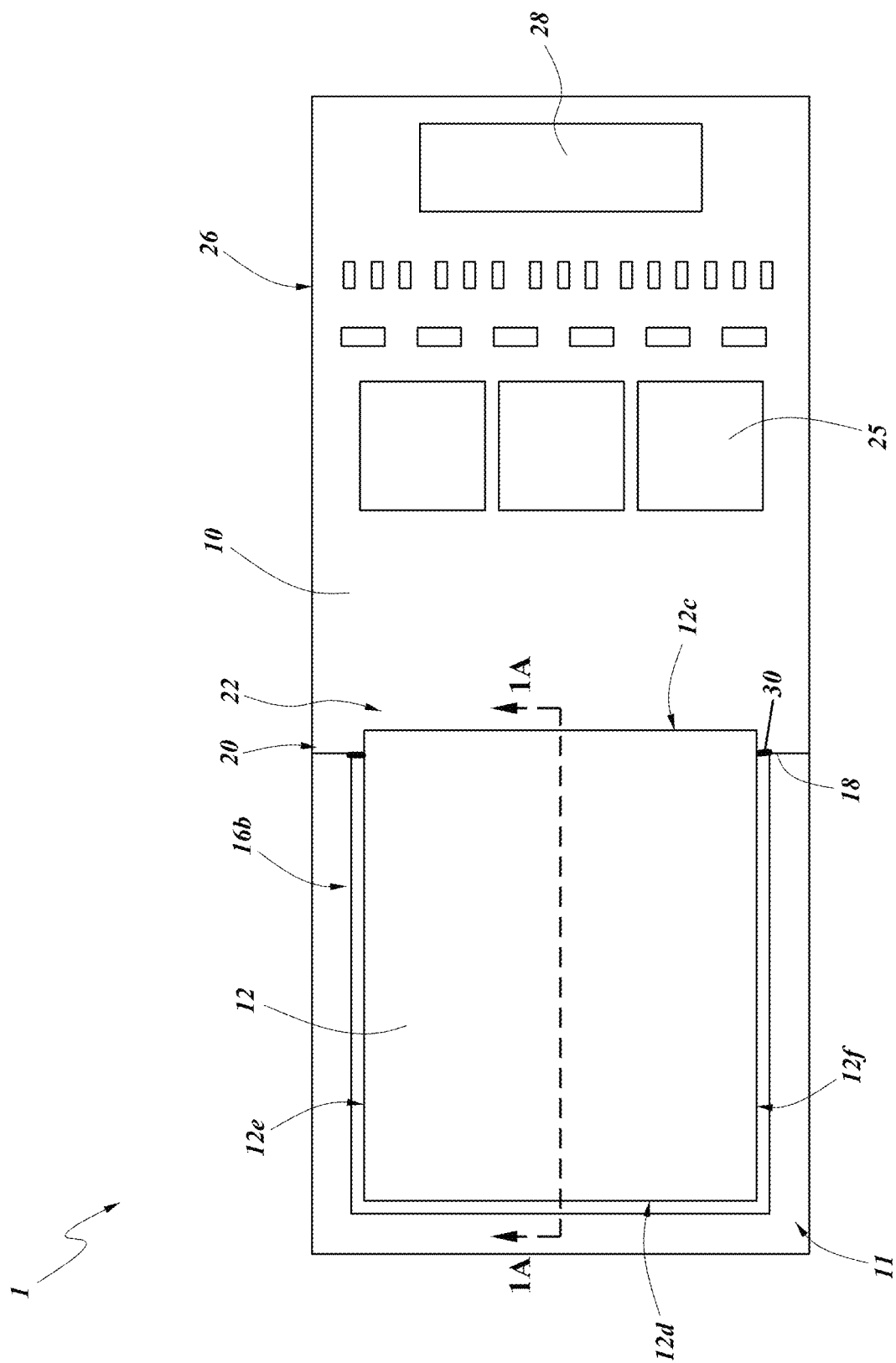

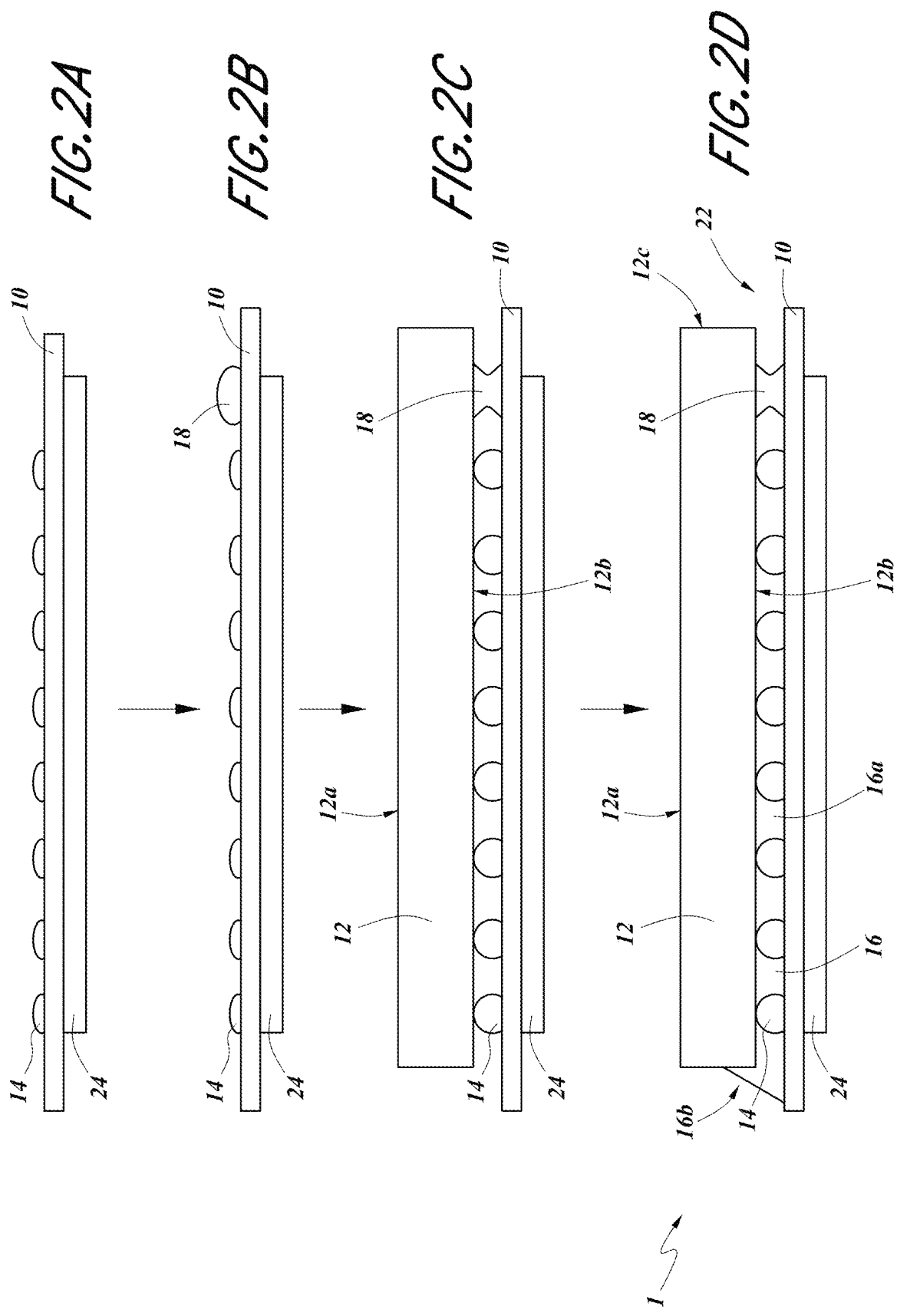

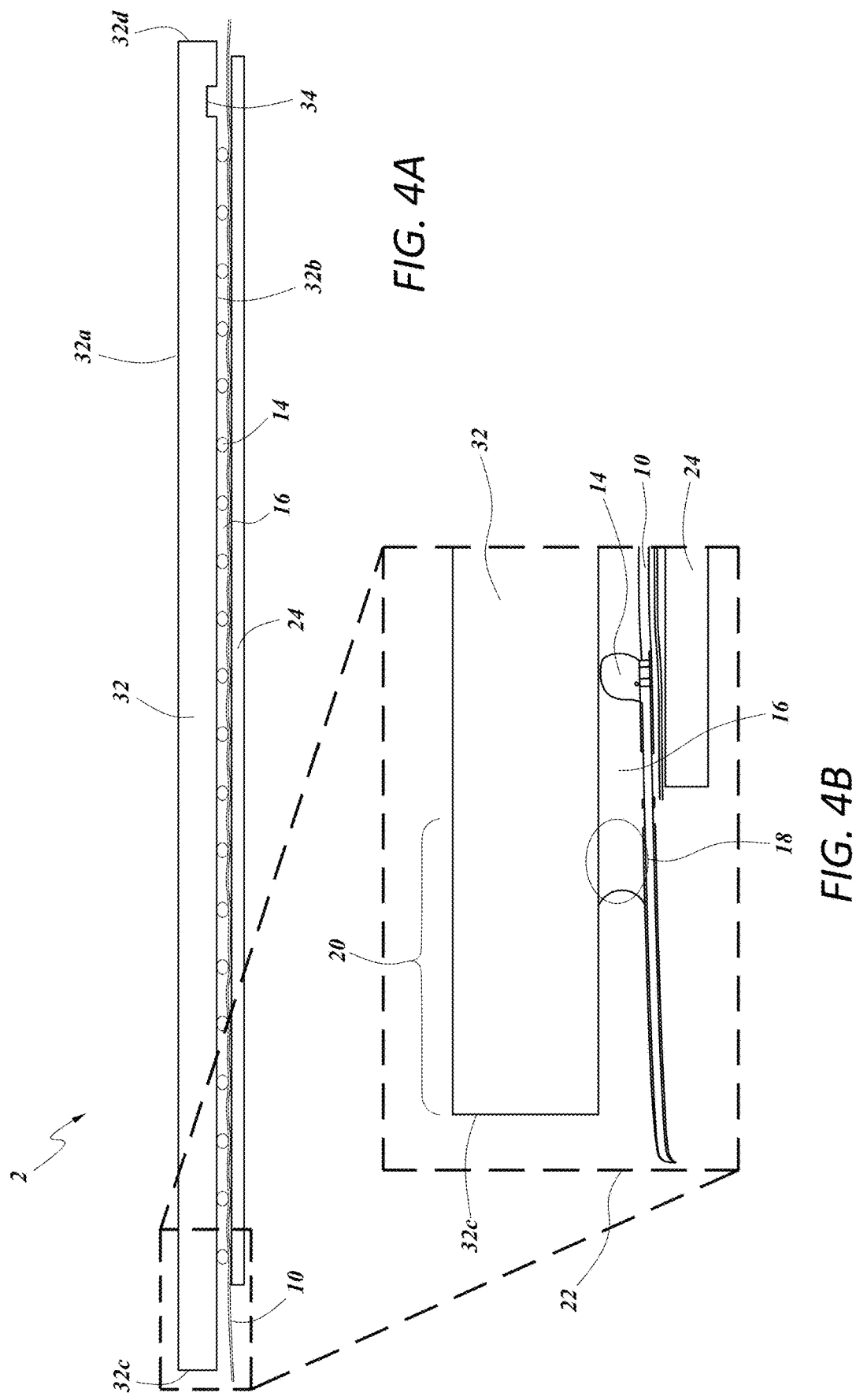

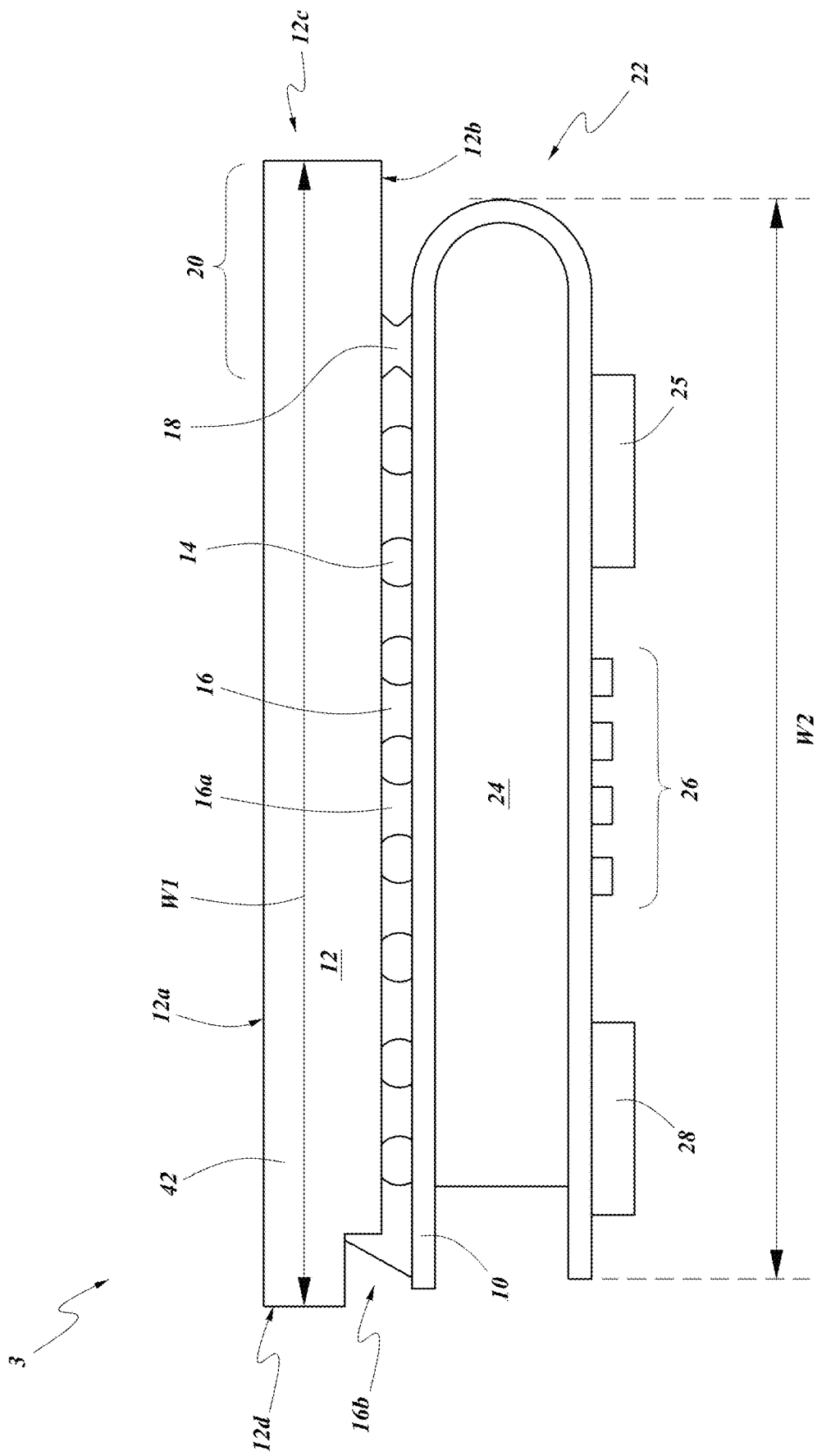

NEGATIVE FILLET FOR MOUNTING AN INTEGRATED DEVICE DIE TO A CARRIER

CROSS-REFERENCE TO RELATED APPLICATIONS

This application is related to U.S. patent application Ser. No. 13/405,594 (now U.S. Pat. No. 8,829,454), filed Feb. 27, 2012; U.S. patent application Ser. No. 14/478,810 (now U.S. Pat. No. 9,466,594), filed Sep. 5, 2014; U.S. patent application Ser. No. 13/708,727 (now U.S. Pat. No. 9,116,022), filed Dec. 7, 2012; U.S. patent application Ser. No. 14/805,835 (now U.S. Pat. No. 10,340,302), filed Jul. 22, 2015; and U.S. patent application Ser. No. 16/017,986 (now U. S. Publication No. 2019/0043823), filed Jun. 25, 2018, the contents of each of which are incorporated by reference herein in their entirety and for all purposes.

BACKGROUND

Field

The present disclosure relates generally to methods and structures for mounting an integrated device die to a carrier, and in particular, to methods and structures that can confine a mounting compound (e.g., underfill, die attach adhesive, etc.) to remain under the die.

Description of the Related Art

Integrated device dies can be mounted to a carrier, such as a package substrate, another integrated device die, an interposer, etc., using compounds that are typically applied in fluid form between the die and the carrier and subsequently hardened or cured. For example, in some integrated device packages, the integrated device die can be flip chip mounted to the carrier by way of solder balls that connect contact pads of a lower surface of the integrated device die to corresponding contact pads of the carrier. An underfill epoxy can be provided between around the solder balls between the integrated device die and the carrier. In other examples, an adhesive is provided between the die and the carrier, such as anisotropic conductive film (ACF) on the backside of the die or conventional die attach adhesives on the front or active side of the die. Often, the compound (e.g., adhesive or underfill epoxy) may extend past the lateral side edges of the integrated device die, which may be undesirable in various applications, e.g., in arrangements in which the die is to be spaced laterally in close proximity to another device or die. Accordingly, there remains a continuing need for improved techniques for mounting an integrated device die to a carrier with an adhesive.

SUMMARY

In one aspect, an electronic module is disclosed. The electronic module includes a package substrate, an integrated device die, a dam structure, and a mounting compound. The integrated device has an upper side, a lower side, and an outer side edge. The dam structure has a first sidewall and a second sidewall opposite the first sidewall. The second sidewall is closer to the outer side edge than the first sidewall. The first sidewall is positioned between a center of the lower side of the integrated device die and the outer side edge. The dam structure disposed between a portion of the package substrate and a portion of the lower side of the integrated device die. The mounting compound is disposed between the lower side of the integrated device die and the package substrate. The dam structure is positioned between the mounting compound and the outer side edge of the integrated device die.

In one embodiment, the dam structure includes a non-conductive epoxy.

In one embodiment, the dam structure is inset from the outer side edge.

In one embodiment, the dam structure includes an hour glass shape.

In one embodiment, the integrated device die includes a sensor die.

In one embodiment, the package substrate includes a flexible substrate.

In one embodiment, the electronic module further includes a stiffener configured to provide mechanical support for the package substrate. The package substrate can wrap around the stiffener. The electronic module can further include an electronic component mounted on the package substrate such that the stiffener in positioned between the integrated device die and the electronic component.

In one embodiment, the integrated device die is at least as wide as the package substrate laterally.

In one embodiment, a dam structure includes a dam dot at a second outer side edge different from the outer side edge. The dam dot can have a thickness that is greater than a thickness of a portion of the dam structure that is disposed between the carrier and the integrated device die.

In one aspect, an electronic module is disclosed. The electronic module includes a substrate, an integrated device die that is mounted to the substrate, a mounting compound, and a dam structure. The integrated device die has an upper side, a lower side opposite the upper side, a first outer side edge region, and a second outer side edge region opposite the first outer side edge region. The mounting compound includes a first portion that is disposed between at least a portion of the lower side of the of the integrated device die and the substrate. The dam structure is disposed along the first outer side edge region. The dam structure is disposed between the substrate and the lower side of the integrated device die. The dam structure has a first sidewall and a second sidewall. The first sidewall faces the mounting compound and the second sidewall faces away from the mounting compound.

In one embodiment, the dam structure includes a non-conductive epoxy.

In one embodiment, the dam structure is inset from the outer side edge.

In one embodiment, the integrated device die includes a sensor die.

In one embodiment, the package substrate includes a flexible substrate.

In one embodiment, the electronic module further includes a stiffener that is configured to provide mechanical support for the package substrate.

In one aspect, an electronic module is disclosed. The electronic module includes a substrate, an integrated device die, mounting compound, and a dam structure. The substrate has a die mount portion and a bent portion that is bent relative to the die mount portion. The integrated device die is mounted to the die mount portion of the substrate. The integrated device die has an upper side, a lower side opposite the upper side, a first outer side edge, and a second outer side edge. The mounting compound is disposed between the integrated device die and the die mount portion of the substrate. The dam structure is disposed between a portion of the die mount portion of the flexible substrate and a portion of the lower side of the integrated device die. The dam structure is configured to prevent overflow of the mounting compound.

In one embodiment, the dam structure includes a non-conductive epoxy.

In one embodiment, the dam structure is inset from the outer side edge.

In one embodiment, the package substrate includes a flexible substrate.

In one embodiment, the electronic module further comprises a stiffener is configured to provide mechanical support for the package substrate.

In one embodiment, the dam structure includes a first sidewall and a second sidewall opposite the first sidewall. The second sidewall is closer to the outer side edge than the first sidewall. The first sidewall can be positioned between a center of the lower side of the integrated device die and the outer side edge.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

FIG. 1B is a schematic top plan view of the electronic module.

FIG. 2A illustrates a step in a process of mounting an integrated device die on a carrier.

FIG. 2B illustrates another step in a process of mounting an integrated device die on a carrier.

FIG. 2C illustrates another step in a process of mounting an integrated device die on a carrier.

FIG. 2D illustrates another step in a process of mounting an integrated device die on a carrier.

FIG. 4A is an image showing a cross sectional side view of an electronic module according to another embodiment.

FIG. 4B is an enlarged image of a portion of the electronic module illustrated in FIG. 4A.

FIG. 5 is a schematic cross sectional side view of an electronic module according to another embodiment.

DETAILED DESCRIPTION

Figure 1A:
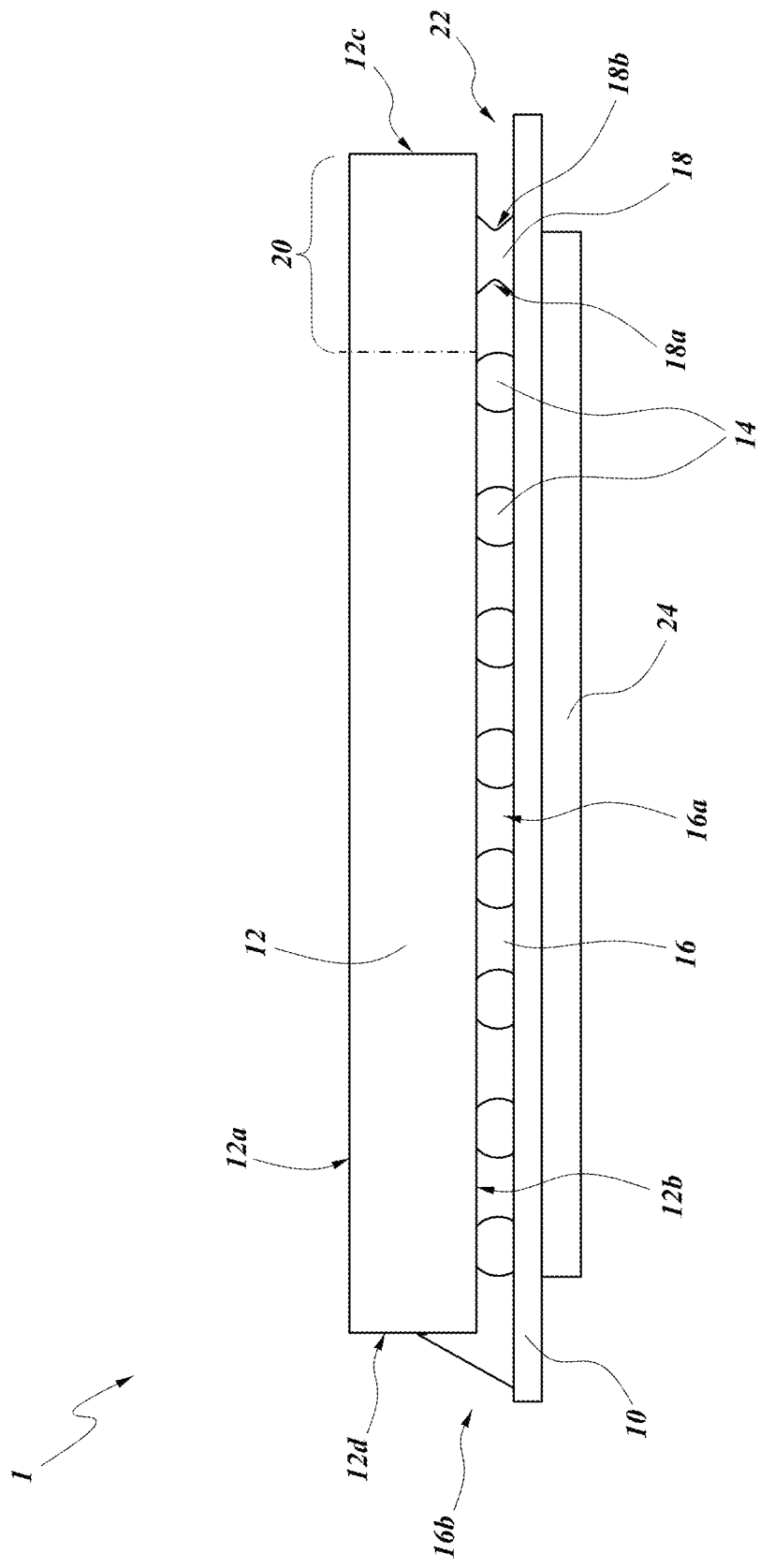
FIG. 1A is a schematic cross sectional side view of a portion of an electronic module that comprises a carrier and an integrated device die mounted to a die mount region of the carrier, according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Various embodiments disclosed herein relate to an electronic module comprising an integrated device die mounted to a carrier. The integrated device die can be mounted to the carrier with a compound such as underfill or adhesive between the integrated device die and the carrier. For example, the integrated device die can be electrically coupled to the carrier by way of an conductive joint (e.g., a gold-gold bond or a solder joint), and the compound can be applied between the integrated device die and the carrier by capillary action. The compound can increase mechanical integrity of the conductive joint to compensate for the thermal expansion coefficient mismatch between the materials of the integrated device die and the carrier. For example, the compound can expand and or contract based on the thermal expansion coefficient differences, thereby protecting the conductive joints from clacking. Therefore, it can be desirable to ensure that all conductive joints between the integrated device die and the carrier are surrounded by the compound.

In some electronic modules, the compound may extend laterally outward past an outer side edge of the integrated device die. In such arrangements, the outwardly extending adhesive may interfere with adjacent components. If the compound extends beyond the outer side edge of the integrated device die, the compound may occupy excessive real estate or interfere with adjacent features of the module. Often the compound is organic, such as plastic or epoxy materials, which is applied in fluid form and subsequently cured or otherwise hardened.

One solution to preventing the compound from overflowing is to control the amount of the compound to be applied. However, because of a stand-off volume variation due to deformation (e.g., warpage) of the integrated device die and/or the carrier during a heating (e.g., baking or thermal compression) process for the conductive joint, it can be difficult to determine a precise amount of the compound that provides a relatively high yield. Some electronic module can have a stand-off gap variation between the carrier and the integrated device die of about 30 µm to 35 µm caused by a thermal compression process. A relatively high yield in certain applications can be more than about 90%, more than about 95%, or more than 98% in a mass production.

Thus, in various embodiments disclosed herein, an electronic module that can prevent or mitigate unwanted overflow of a compound (e.g., underfill) while ensuring that the conductive joints are protected is disclosed. In some embodiments, the electronic module can include a carrier (e.g., a package substrate), an integrated device die (e.g., a sensor die) that is mounted to the carrier, and the compound disposed between the carrier and the integrated device die. The carrier can have a region that an overflow of the compound is unwanted or undesirable. For example, a compound free region of the carrier near an outer side edge of the integrated device die is desired to be free from the compound material. The electronic module can include a dam disposed neat the outer side edge of the integrated device die and extends between a portion of the integrated device die and a portion of the carrier. The dam can prevent or mitigate the compound from reaching the compound free region of the carrier. In some embodiments, the compound free region can comprise a bent portion for wrapping the carrier about a stiffener.

FIG. 1A is a schematic cross sectional side view of a portion of an electronic module 1 that comprises a carrier 10 and an integrated device die 12 mounted to a die mount region 11 of the carrier 10, according to one embodiment. FIG. 1B is a schematic top plan view of the electronic module 1. The carrier 10 and the integrated device die 12 can be electrically coupled by way of conductive joints. In some embodiments, the conductive joints can comprise a plurality of solder balls 14. The electronic module 1 can also comprise a compound 16 disposed around the plurality of solder balls 14. In various embodiments, the electronic module 1 can comprise a sensor module or any other type of electronic device. In some embodiments, the electronic module 1 can comprise an integrated device package.

The carrier 10 can comprise any suitable carrier. For example, in some embodiments, the carrier 10 can comprise a package substrate, such as a flexible substrate including a nonconductive material and a plurality of embedded metal traces, a printed circuit board (PCB), a leadframe substrate, a ceramic substrate, etc. In other embodiments, the carrier 10 can comprise another integrated device die, an interposer, or any other suitable type of carrier. The integrated device die can comprise any suitable type of integrated device die, including, e.g., a sensor die, a processor die, a memory die, a microelectromechanical systems (MEMS) die, etc.

The integrated device die 12 can comprise any suitable type of integrated device die, including, e.g., a sensor die, a processor die, a memory die, a microelectromechanical systems (MEMS) die, etc. The integrated device die 12 can comprise an upper surface 12a and a lower surface 12b opposite the upper surface 12a. The upper surface 12a can be a surface on an upper side of the integrated device die 12 and the lower surface 12b can be a surface on a lower side of the integrated device die 12. In some embodiments, active components (e.g., active circuitry) can be provided at or near the lower surface 12b of the die 12. The integrated device die 12 can comprise one or a plurality of outer side edges that define an outer periphery of the die 12. In some embodiments, the plurality of outer side edges can include a first outer side edge 12c, a second outer side edge 12d generally parallel with the first outer side edge 12c, a third outer side edge 12e generally perpendicular with the first and second outer side edges 12c, 12d, and a fourth outer side edge 12f generally parallel with the third outer side edge 12e.

The plurality of solder balls 14 can electrically connect first contact pads (not shown) on the lower surface 12b of the integrated device die 12 with corresponding second contact pads (not shown) on the carrier 10. In such embodiments, the compound 16 can comprise an underfill material (e.g., an underfill epoxy) disposed around the plurality of solder balls 14. Thus, the compound 16 can be applied in fluid form, flowed around the solder balls 14 or interconnects to protect and enhance the reliability of the electrical connections between the die 12 and the carrier 10, and/or to improve thermal matching between the die 12 and the carrier 10. In some embodiments, the compound 16 can be applied between the integrated device die 12 and the carrier 10 by capillary action. An example of such under fill material can include Henkel Eccobond UF8000AA manufactured by Henkel Corporation. In other embodiments, the compound 16 can comprise a die attach material that is not used as underfill for solder ball connections. For example, the compound 16 can comprise a conventional die attach adhesive applied to the back side of the die 12 and the die 12 can be electrically connected in other ways, such as by bonding wires. In another example, the compound 16 can comprise anisotropic conductive film (ACF) or nonconductive paste (NCP) applied to the front side of the die 12 to serve electrical, adhesive and/or protective sealing functions.

The electronic module 1 can also include a dam structure 18 that is positioned in an outer side edge region 20 at or near the first outer side edge 12c of the integrated device die 12, and extending between a portion of the carrier 10 and a portion of the integrated device die 12. In some embodiments, the dam structure 18 can be in contact with both the portion of the carrier 10 and the potion of the integrated device die 12. In some other embodiments, the dam structure 18 can extend from the portion of the carrier 10 towards the portion of the integrated device die 12, and only in contact with the portion of the carrier 10. In some other embodiments, the dam structure 18 can extend from the portion of the integrated device die 12 towards the portion of the carrier 10, and only in contact with the portion of the integrated device die 12. The dam structure 18 can prevent or mitigate the compound 16 from overflowing beyond the first outer side edge 12c. In some embodiments, the dam structure 18 can block the compound 16 so as to prevent or mitigate the compound 16 from reaching a compound free region 22 on the carrier 10. The compound free region 22 can be a region where the compound is unwanted or undesired. In some embodiments, the compound free region 22 can be configured to bend or fold so as to allow the carrier 10 to wrap around a stiffener (see FIGS. 1C, 3B-5). In some embodiments, the compound free region 22 of the carrier 10 can overlap with a portion of the integrated device die 12 so as to provide a negative epoxy edge fillet structure. The outer side edge region 20 can include a region near the first outer side edge 12c. In some embodiments, the dam structure 18 can be laterally inset from the first outer side edge 12c. For example, the dam structure 18 can be laterally inset in a range of, for example, 50 µm to 500 µm, in a range of, for example, 100 µm to 500 µm, in a range of, for example, 100 µm to 300 µm, or in a range of, for example, 200 µm to 300 µm. For example, the dam structure 18 can be disposed between a center of the lower surface 12b and the first side edge 12c of the integrated device die 12. For example, the dam structure 18 can be laterally inset by a range of, for example, 1% to 50%, by a range of, for example, 1% to 25%, or by a range of, for example, 1% to 15% of a length between the first outer side edge 12c and the second outer side edge 12d.

Though the dam structure 18 is provided only along one side of the integrated device die 12 in FIGS. 1A and 1B, the dam structure 18 can be provided along two or more sides of the integrated device die 12 in some embodiments. In some other embodiments, the dam structure 18 can be provided partially along an side edge region of the integrated device die 12 such that a length of the dam structure 18 is shorter than a length of the side of the integrated device die 12. In some embodiments, portions of the dam structure 18 can be in contact with the third outer side edge 12e and/or the fourth outer side edge 12f. The portion of the dam structure 18 that makes contact with the third outer side edge 12e or the fourth outer side edge 12f can have a dam thickness that is greater than a thickness of a portion of the dam structure that is disposed between the carrier 10 and the integrated device die 12. In some embodiments, the thicker portion of the dam structure 18 can comprise a dam dot 30. The dam dot 30 can provide a sufficient thickness for the dam structure 18 to mitigate or prevent the compound 16 from reaching the compound free region 20 of the carrier 10. In some embodiments, the thicker portion of the dam structure 18 can comprise a thicker line.

The dam structure 18 can comprise any suitable non-conductive material. In some embodiments, the dam structure 18 can comprise a non-conductive epoxy, such as ALPHA® HiTech™ AD13-9620B manufactured by MacDermid Alpha Electronics Solutions. The dam structure 18 can have a first sidewall 18a that is in contact with the compound 16, and a second sidewall 18b opposite the first sidewall 18a. In some embodiments, the second sidewall 18b is closer to the first outer side edge 12c than the first sidewall 18a. In some embodiments, the second sidewall 18b can be free from the compound 16. The dam structure 18 can have any shape. For example, as illustrated, the dam structure can have an hour glass shape in which, the first and second sidewalls 18a, 18b comprise angled sidewalls. In some embodiments, the dam structure 18 can comprise a single layer dam structure of one material. In some other embodiments, the dam structure 18 can comprise a multi-layer dam structure of different materials or the same material. In some embodiments, the first sidewall 18a can face the compound 16 and the second sidewall 18b can face away from the mounting compound. In some embodiments, the first sidewall 18a can be in contact with the compound 16 and the second sidewall 18b can be free from the compound 16.

As described above, the dam structure 18 can be laterally inset from the first outer side edge 12c. In some embodiments, the first sidewall 18a of the dam structure 18 can be laterally inset from the first outer side edge 12c. For example, the first sidewall 18a of the dam structure 18 can be laterally inset in a range of, for example, 50 μm to 500 μm, in a range of, for example, 100 μm to 500 μm, in a range of, for example, 100 μm to 300 μm, or in a range of, for example, 200 μm to 300 μm. For example, the first sidewall 18a of the dam structure 18 can be disposed between the center of the lower surface 12b and the first side edge 12c of the integrated device die 12. For example, the first sidewall 18a of the dam structure 18 can be laterally inset by a range of, for example, 1% to 50%, by a range of, for example, 1% to 25%, or by a range of, for example, 1% to 15% of a length between the first outer side edge 12c and the second outer side edge 12d. In some embodiments, a width of the dam structure 18 from the first sidewall 18a to the second sidewall 18b can vary along the length of the dam structure.

The compound 16 comprise a first portion 16a that is disposed between the carrier 10 and the integrated device die 12, and a second portion 16b that is overflown or bled out beyond the second to fourth outer side edges 12d, 12e, 12f. In FIG. 1B, the second portion 16b of the compound 16 is illustrated as uniformly overflown along the second to fourth outer side edges 12d, 12e, 12f. However, in some embodiments, the amount of the second portion 16b may vary at different locations near the second to fourth outer side edges 12d, 12e, 12f. In some embodiments, one or more of the second to fourth outer side edges 12d, 12e, 12f can be free from overflown compound.

The carrier 10 can be mounted on or coupled to a portion of a stiffener 24. The stiffener 24 can provide structural support for the electronic module 1 and can assist in thermally separating the dies 12 from other components on the carrier 10, as described in U.S. Pat. No. 10,340,302, which is incorporated by reference herein. As discussed in more detail below, the carrier 10 can be wrapped around the stiffener 24.

In some embodiments, the electronic module 1 can also comprise a plurality of electronic components mounted to the carrier 10. In some embodiments, the plurality of electronic components can electrically couple with the integrated device die 12. In some embodiments, the electronic components can process data received from the integrated device die 12. In some embodiments, the plurality of electronic components can include an analog—to digital convertor 25 and passive components 26. The electronic module 1 can further comprise a connector 28 for connecting the electrical module 1 to an external device or component. In some embodiments, the electronic module 1 can connect to an external device by wat of a connector assembly through the connector 28.

Figure 1C:
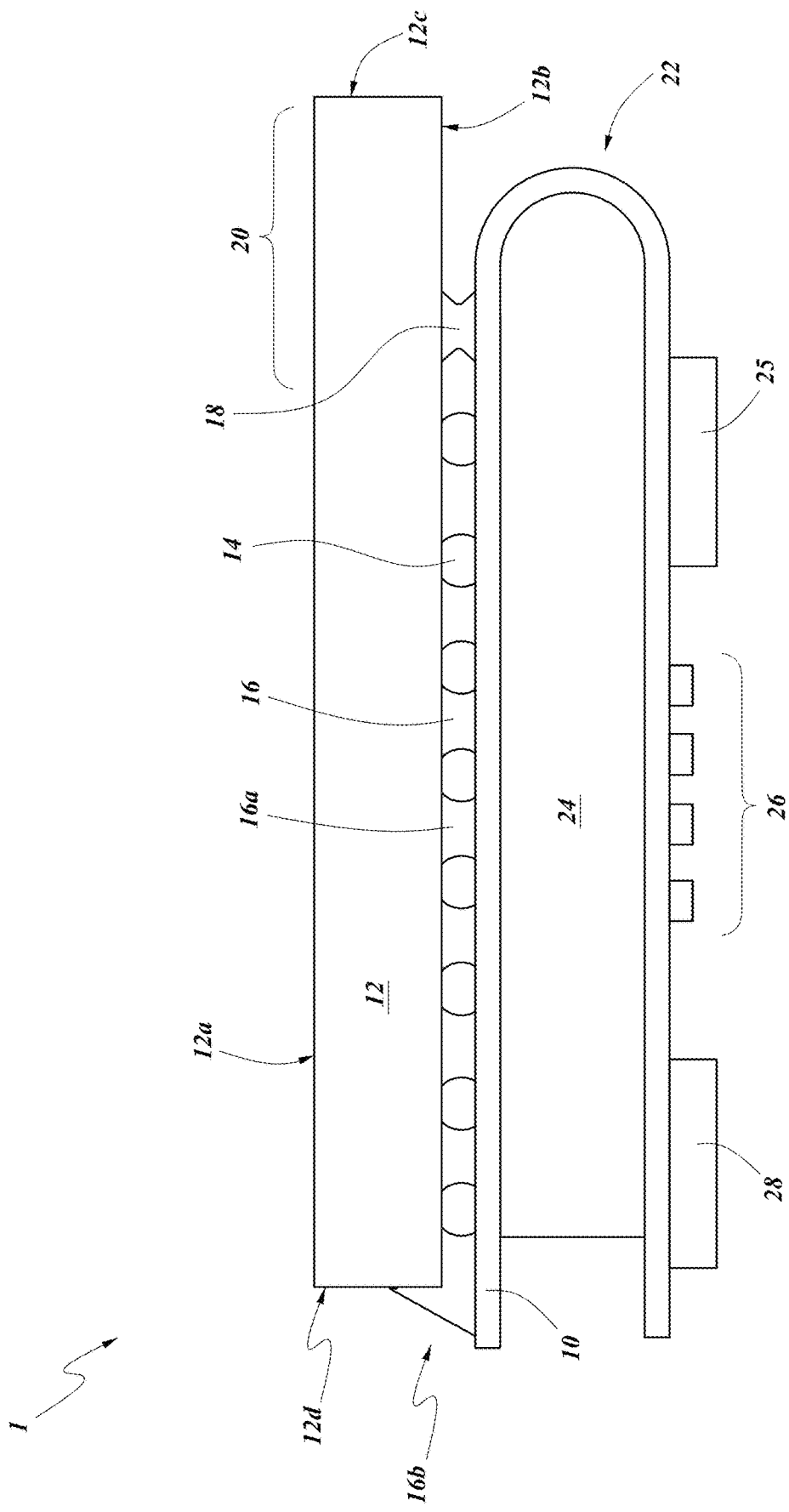
FIG. 1C is a schematic cross sectional side view of the electronic module that is wrapped at least partially around a stiffener.

FIG. 1C is a schematic cross sectional side view of the electronic module 1 that is wrapped at least partially around the stiffener 24. In some embodiments, the compound free region 22 of the carrier 10 can be bent, folded, or carved such that the stiffener 24 is positioned between the integrated device die 12 and the analog-to-digital converter 25. The stiffener 24 can provide structural support for the electronic module 1 and can assist in thermally separating the integrated device die 12 from other components on the carrier 10 such as the converters 25 and/or the passive components 26. The stiffener 24 can be made of any suitable material, such as a metal, e.g., zinc or aluminum. In other arrangements, the stiffener 24 can be made of a plastic or ceramic.

In some embodiments, the dam structure 18 can be inset from the first outer side edge 12c so as to allow the carrier 10 to bend, fold, or carve under the integrated device die 12. When the carrier 10 bends under the integrated device die, the carrier 10 can be inset from the first outer side edge 12c. In certain arrangements, it can be beneficial to have the carrier 10 inset from the first outer side edge 12c. For example, the integrated die 12 can abut and/or be closely spaced relative to an adjacent component, such as another integrated device die.

FIGS. 2A-2D illustrates a process of mounting an integrated device die 12 on a carrier 10. FIG. 2A shows a schematic cross sectional side view of the carrier 10 provided on a stiffener 24. A plurality of solder balls 14 can be provided on the carrier 10. In some embodiments, the plurality of solder balls 14 can be screen printed on the carrier 10. The carrier 10 can comprise any suitable carrier. For example, in some embodiments, the carrier 10 can comprise a package substrate, such as a flexible substrate including a nonconductive material and a plurality of embedded metal traces, a printed circuit board (PCB), a leadframe substrate, a ceramic substrate, etc.

A dam structure 18 can be provided on the carrier 10 in FIG. 2B. The dam structure 18 can be provided on the carrier 10 by any suitable method. For example, the dam structure 18 can be dispensed on the carrier 10. For example, the dam structure 18 can be provided by way of a stamping and/or bade transfer process. In some embodiments, the stamping process can utilize a pick and place process. The dam structure 18 can comprise any suitable non-conductive material. In some embodiments, the dam structure 18 can comprise a non-conductive epoxy, such as ALPHA® HiTech™ AD13-9620B manufactured by MacDermid Alpha Electronics Solutions. In some embodiments, the dam structure 18 can be provided in a gel state, which can be cured after the integrated device die 12 is provided on the carrier 10. In some embodiments, the dam structure 18 can comprise a line with various thicknesses. For example, the line of the dam structure 18 can have thinner portions and two thicker portions. The two thicker portions can be positioned such that when the integrated device die 12 is provided in FIG. 2C, edges of the integrated device die 12 are positioned over the two thicker portions. In some embodiments, the thicker portions of the dam structure 18 can be referred to as dam dots 30 (FIG. 1B).

The integrated device die 12 can be provided on the carrier 10 in FIG. 2C. The plurality of solder balls 14 can electrically connect first contact pads (not shown) on a lower surface 12b of the integrated device die 12 with corresponding second contact pads (not shown) on the carrier 10. The plurality of solder balls 14 can be heated to reflow. The dam structure 18 can be heated after the integrated device die 12 is provided to cure the dam structure 18. The dam structure 18 can extend between the carrier 10 and a portion of the lower surface 12b of the integrated device die 12.

At FIG. 2D, a compound 16 can be applied in fluid form, flowed around the solder balls 14 or interconnects to protect and enhance the reliability of the electrical connections between the die 12 and the carrier 10, and/or to improve thermal matching between the die 12 and the carrier 10. The compound 16 can comprise an underfill material (e.g., an underfill epoxy). In some embodiments, the compound 16 can be applied between the integrated device die 12 and the carrier 10 by capillary action. An example of such underfill material can include Henkel Eccobond UF8000AA manufactured by Henkel Corporation. The compound 16 can have a first portion 16a that is disposed between the carrier 10 and the integrated device die 12, and a second portion 16b that is overflown or bled out beyond outer side edges of the integrated device die 12. When the compound is applied, the dam structure 18 can prevent or mitigate overflow of the compound at or near a first outer side edge 12c so as to keep a compound free region 22 of the carrier 10 free from the compound 16.

Figure 3A:
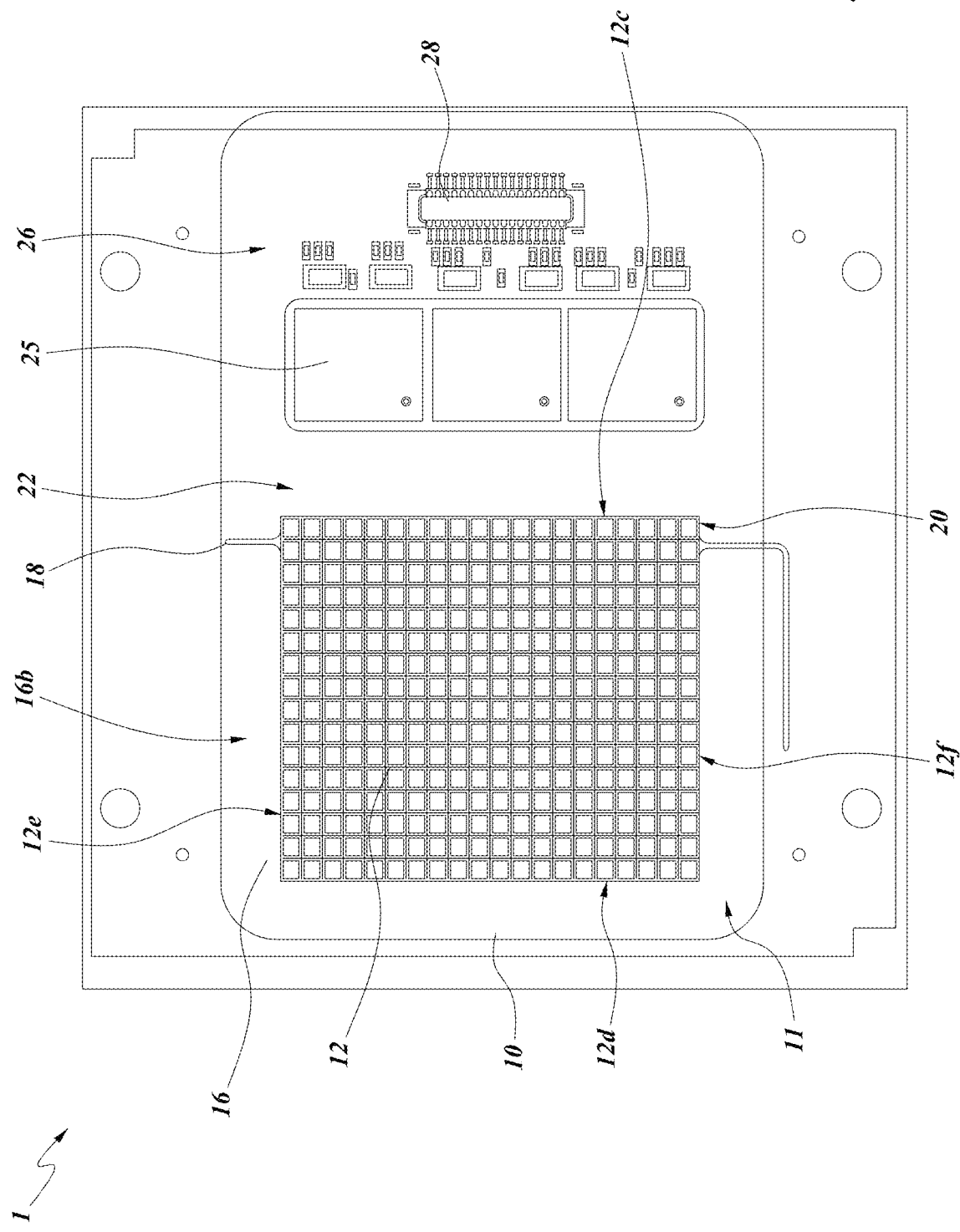
FIG. 3A is an image showing a top plan view of an electronic module according to one embodiment.

FIG. 3A is an image showing a top plan view of an electronic module 1 according to one embodiment. The electronic module 1 can include a carrier 10 (e.g., a flexible substrate), an integrated device die 10 (e.g., a sensor die) mounted on a die mount region 11 of the carrier 10, a plurality of electronic components (e.g., analog-to-digital converters 25 and passive components 26) mounted on the carrier 10, and a connector 28 for connecting the electronic module 1 to an external device or substrate. The integrated device die 12 can have first to fourth side edges 12c-12f. In the image in FIG. 3A, a visible overflow (a second portion 16b) of a compound 16 that mounts the integrated device die 12 to the carrier 10 can be observed at or near the third outer side edge 12e of the integrated device die 12. The electronic module 1 can also include a dam structure 18 in an outer side edge region 20 at or near the first outer side edge 12c of the integrated device die 12. The dam structure 18 can prevent or mitigate the compound 16 from reaching a compound free region 22 of the carrier 10.

Figure 3B:
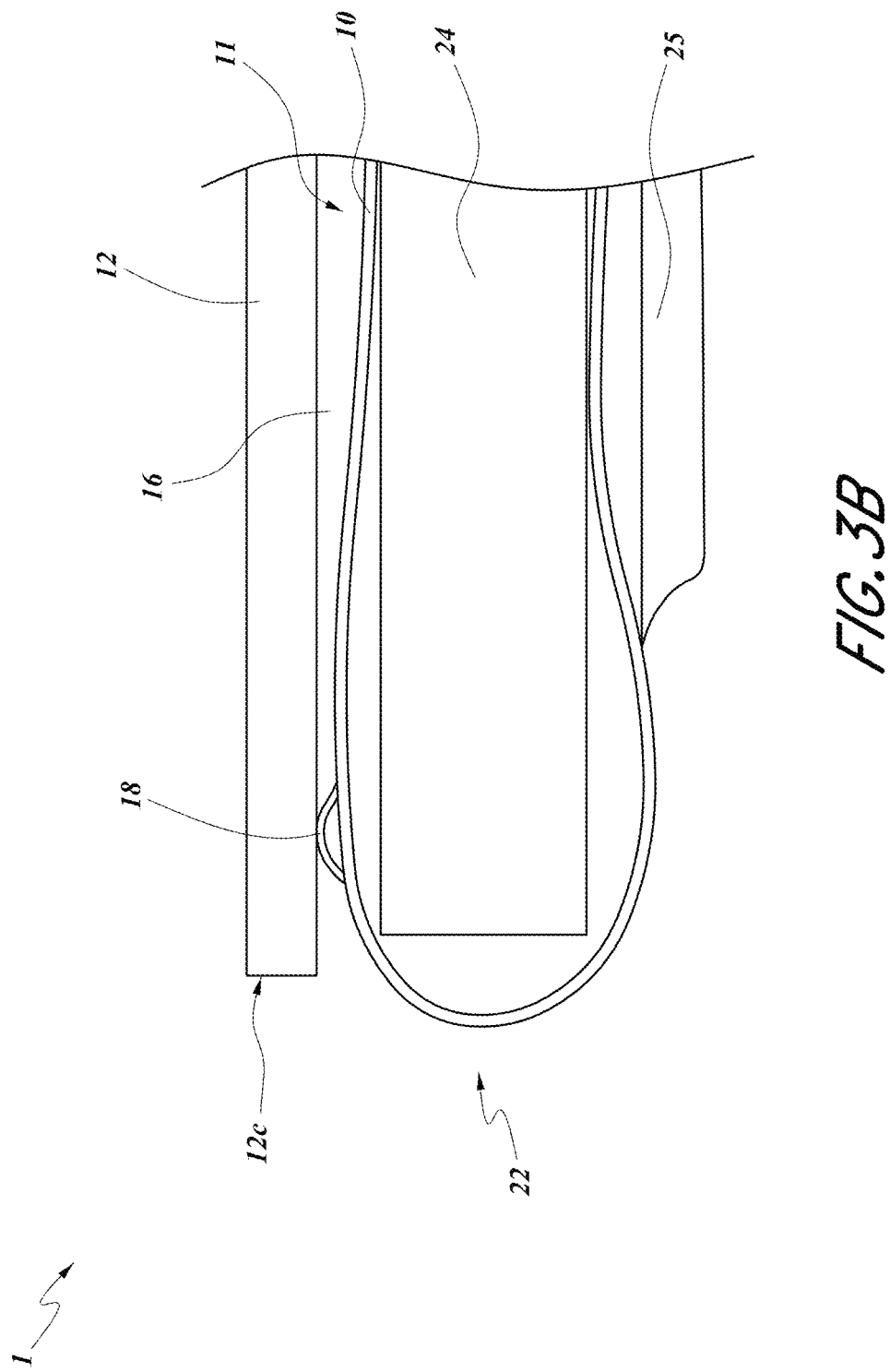
FIG. 3B is an image showing a side view of a portion of the electronic module according to another embodiment.

FIG. 3B is an image showing a side view of a portion of the electronic module 1 according to one embodiment. The carrier 10 of the electronic module shown in FIG. 3B is folded or wrapped around the stiffener 24. In some embodiments, the compound free region 22 of the carrier 10 can be bent or carved such that the stiffener 24 is positioned between the integrated device die 12 and the analog-to-digital converter 25. In some embodiments, the dam structure 18 can be inset from the first outer edge 12c so as to allow the carrier to bend or carve under the integrated device die 12. The stiffener 24 can provide structural support for the electronic module 1 and can assist in thermally separating the dies 12 from other components on the carrier 10. The stiffener 24 can be made of any suitable material, such as a metal, e.g., zinc or aluminum. In other arrangements, the stiffener 24 can be made of a plastic or ceramic.

FIG. 4A is an image showing a cross sectional side view of an electronic module 2 according to one embodiment. FIG. 4B is an enlarged image of a portion of the electronic module 2 illustrated in FIG. 4A. The electronic module 2 can include a carrier 10, an integrated device die 32 that is mounted to the carrier 10, a compound 16 (e.g., underfill) disposed at least partially between the carrier 10 and the integrated device die 32, and a stiffener 24 that is configured to provide mechanical support for the carrier 10. The integrated deice die 32 can have an upper surface 32a on an upper side of the integrated device die 32, a lower surface 32b on a lower side of the integrated device die 32 opposite the upper surface 32a, and outer side edges that includes a first outer side edge 32c and a second outer side edge 32d. The electronic module 1 shown in FIGS. 1A-3B and the electronic module 2 can have generally similar components and functionalities. Unlike the integrated device die 12 of the electronic module 1, the integrated device die 32 of the electronic module 2 can comprise a groove 34 defined partially through the lower surface 32b of the integrated device die 32 near the second outer side edge 32d. The groove 34 can prevent or mitigate the compound from overflowing or bleeding. Additional details of grooves may be found at least in U.S. Publication No. 2019/0043823, the entire contents of which are incorporated by reference herein in their entirety and for all purposes.

FIG. 5 is a schematic cross sectional side view of an electronic module 3 according to one embodiment. The electronic module 3 can include a carrier 10, an integrated device die 42 that is mounted to the carrier 10, a compound (e.g., underfill) disposed at least partially between the carrier 10 and the integrated device die 42, and a stiffener 24 that is configured to provide mechanical support for the carrier 10. The integrated deice die 42 can have an upper surface 42a on an upper side of the integrated device die 42, a lower surface 42b on a lower side of the integrated device die 42 opposite the upper surface 42a, and outer side edges that includes a first outer side edge 42c and a second outer side edge 42d. The electronic module 1 shown in FIGS. 1A-3B, the electronic module 2 shown in FIGS. 4A and 4B, and the electronic module 3 shown in FIG. 5 can have generally similar components and functionalities. Unlike the integrated device die 32 of the electronic module 2, the integrated device die 42 of the electronic module 3 can comprise a recessed surface 44 near the second outer side edge 42d that is recessed relative to the lower surface 42d of the integrated device die 42. The groove 44 can prevent or mitigate the compound from overflowing or bleeding. Additional details of recessed surfaces may be found at least in U.S. Publication No. 2019/0043823, the entire contents of which are incorporated by reference herein in their entirety and for all purposes.

The carrier 10 has a width W1, and the integrated device die 42 has a width W2. In some embodiments, the width W2 of the integrated device die 42 may be larger than or at least as wide as (e.g., as wide as, or wider than) the width W2 of the carrier 10. In some embodiments, such relative dimensions may help two or more modules to be placed next to one another more accurately than a module with the carrier 10 that is larger than the die 42. A width of any of the integrated devices disclosed herein (e.g., the integrated device die 12, the integrated device die 32) may be larger than or at least as wide as (e.g., as wide as, or wider than) the width W2 of the carrier 10.

Figure 6:
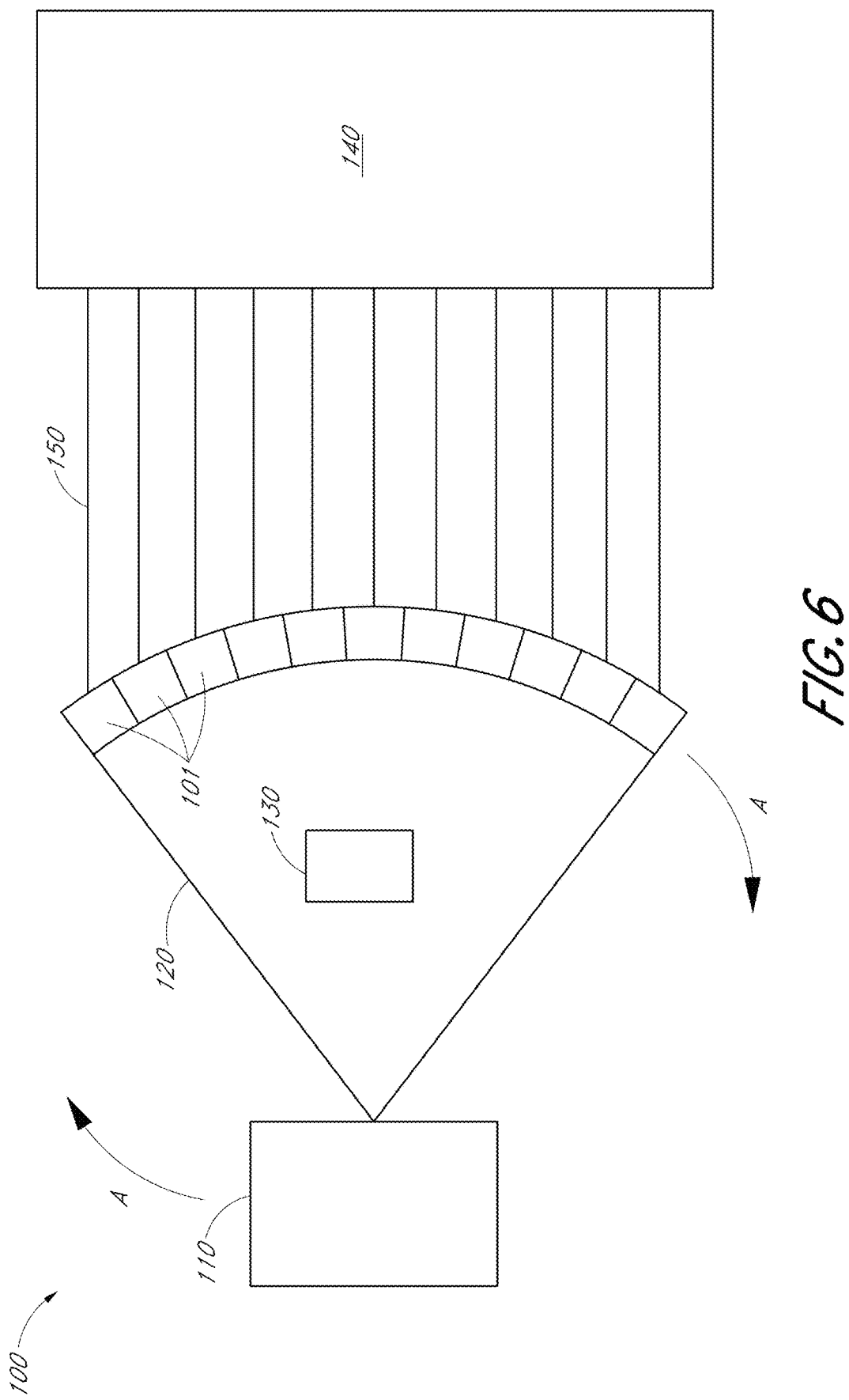
FIG. 6 is a schematic plan view of an imaging system, according to one embodiment.

Examples of Electronic Modules with a Negative Fillet Adhesive for Mounting a Die to a Carrier The negative fillet adhesives disclosed herein can be used with any type of electronic module. FIG. 6 illustrates an imaging system 100 according to one embodiment that utilizes such negative fillet adhesives. In some implementations, the imaging system 100 can be a computed tomography (CT) device. CT devices are useful in a variety of fields, including medical imaging, industrial imaging, non-destructive testing, and subsurface imaging. In the imaging system 100 of FIG. 6, a source 110 can emit radiation 120 in the direction of an object 130 to be imaged (e.g., a patient). In one embodiment, the source 110 emits x-ray radiation. Skilled artisans will understand that there are various conventional mechanisms to emit radiation for imaging purposes. After some portion of the radiation 120 passes through the object 130, it reaches a one-dimensional (1D) or two-dimensional (2D) array of electronic modules 101 (e.g., sensor modules) positioned opposite the source 110. The array of electronic modules 101 can comprise any of the electronic modules disclosed herein. The electronic modules 101 can be configured to convert detected radiation (e.g., visible light) to electrical signals using a photodiode array (PDA), which can be the sensor of this imaging example. In some implementations, the electronic module 101 may also be configured to convert detected x-ray radiation to visible light, or the system 100 can include a separate scintillator for that purpose. In other implementations, detected x-ray radiation may be converted to electrical signals in other ways. The electronic module 101 is also configured to convert the analog signals received from the PDA into digital signals that can be transmitted by transmission elements 150 to an external control module 140. The electronic module 101 can also perform various other preprocessing and/or preconditioning operations on the detected signals before transmission to the control module 140. After the processed digital signals are received by the control module 140, the control module 140 can further process the digital signals into a readable output, such as an image on a display device or a report of various measured values calculated from the received signals. To obtain a full 3D image of the object 130, the system 100 can rotate around the object 130 in the direction A shown in FIG. 6 to obtain images of the subject 130 at various angles.

In other embodiments, the imaging system can be an ultrasound device. Although an ultrasound device is not expressly illustrated herein, it should be appreciated that an ultrasound device, according to some embodiments, can include a source of ultrasonic waves and a detector (or detector array) that includes one or more electronic modules similar to those described in more detail below. Furthermore, the electronic module(s) can be used in nuclear imaging implementations, such as PET scans and gamma ray imaging techniques. In yet other embodiments, the electronic modules can be used in various non-imaging arrangements, e.g., electrical, electronic, or optical applications that employ a compact module that includes both a sensor and a processor. For example, microelectromechanical systems (MEMS) devices, such as MEMS microphones and accelerometers, may include both a sensor die and a processor die near the sensor in order to process signals from the sensor. In these embodiments, electronic modules similar to those illustrated herein may be useful in providing a compact sensor package, while thermally insulating the sensor from the processor.

Figure 7:
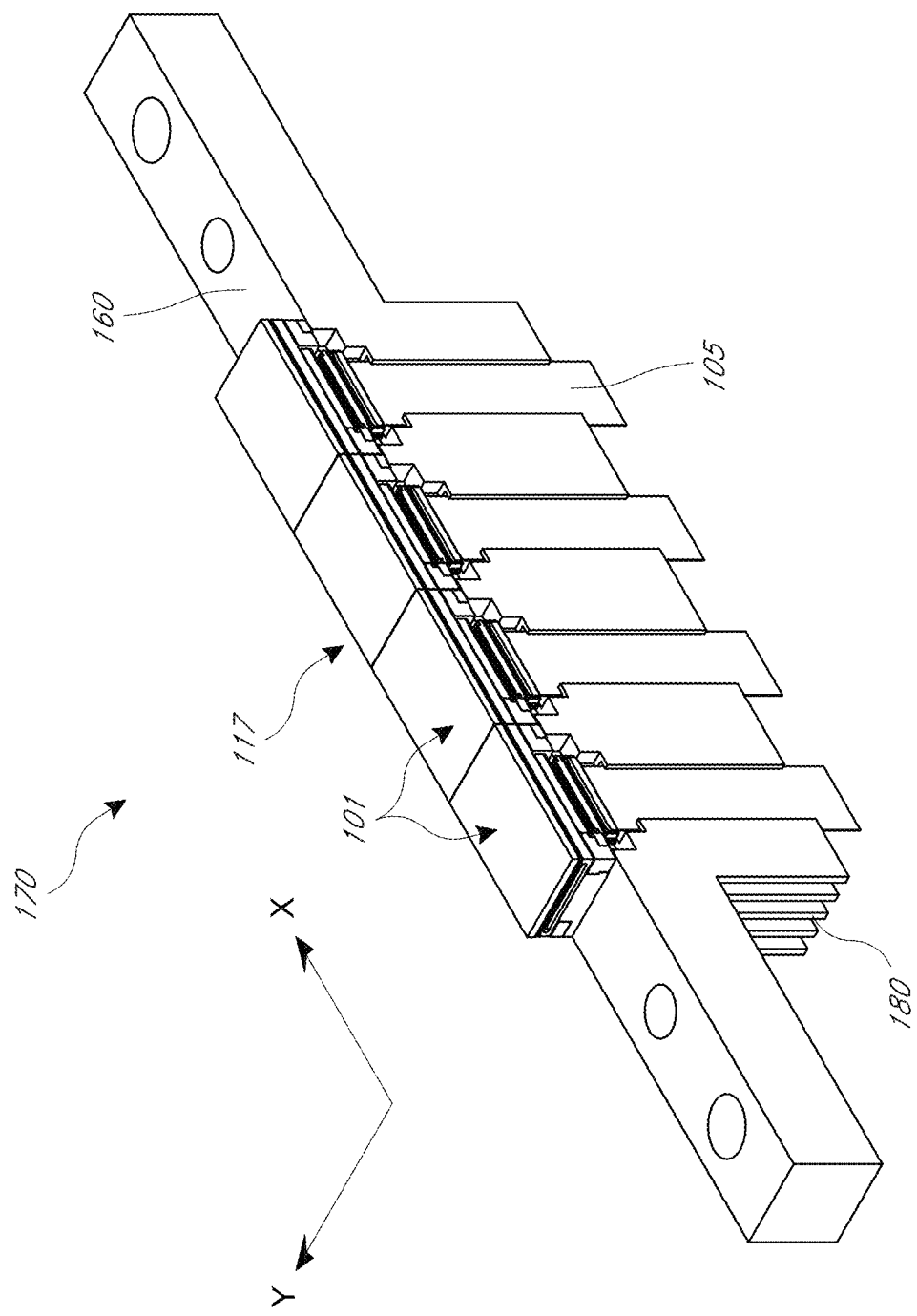
FIG. 7 is a three-dimensional schematic perspective view of a portion of an array of electronic modules, in accordance with an embodiment.

FIG. 7 is a three-dimensional schematic perspective view of a portion of an array of electronic modules 101. As shown in FIG. 7, each electronic module 101 can be mounted on a bracket 160 that is part of a larger imaging system 170. The imaging system 170 may be the same as or similar to the imaging system 100 described above with respect to FIG. 7. For example, the imaging system may comprise a CT device, an X-ray device, an ultrasound device, etc. In the example of FIG. 7, four electronic modules 101 (e.g., four sensor modules) are positioned in a string 117 that extends along a longitudinal X-axis, however, it should be appreciated that more or fewer than four modules 101 can be positioned in the string 117 adjacent one another along the X-axis. Although not illustrated in FIG. 7, the array of modules 101 can comprise multiple strings 117 adjacent one another along a direction which is transverse to the X-axis. In some embodiments, the strings 117 can be positioned along a curved surface, each string 117 representing one of the modules 100 of FIG. 6. As shown in FIG. 7, for example, the Y-axis of the illustrated string 117 can be tangent to the curved surface along which the array of modules 101 is positioned. In various arrangements, a patient can be positioned inside the curved surface of the array, and the system 170 can image portions of the patient's body.

As shown in FIG. 7, the electronic modules 101 can be mounted on a front side of the bracket 160 and one or more heat sinks 180 can be disposed on a back side of the bracket 160. Each heat sink 180 can comprise fins or other heat transfer elements that can effectively dissipate heat generated by the modules 101 into the atmosphere. In some embodiments, a fan can direct air over the heat sink 180 to improve heat dissipation from the modules 101; in other embodiments, the heat sink 180 can be exposed to ambient air without the use of a fan. In addition, as shown in FIG. 7, a connector substrate 105 can extend downwardly from each module 101 to connect to an external control module, which may be the same as or similar to the control module 140 described above in connection with FIG. 6. Furthermore, as shown in FIG. 7, it can be important to space adjacent modules 101 apart along the bracket 160 by a small gap so that adjacent modules 101 do not touch one another.

Figure 8:
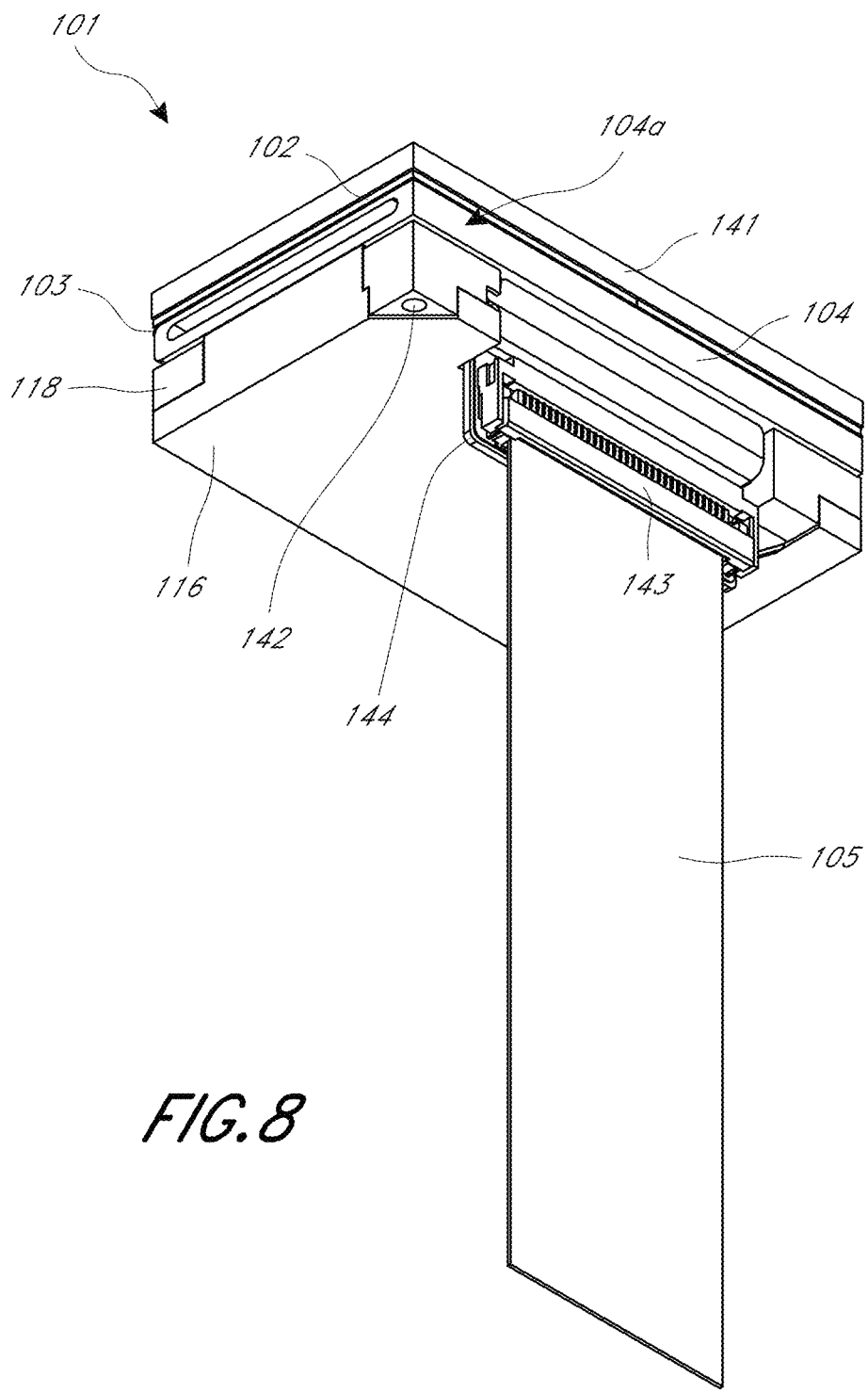
FIG. 8 is a three-dimensional schematic top perspective view of one the electronic modules shown in FIG. 3.

FIG. 8 is a three-dimensional schematic top perspective view of the electronic module 101 shown in FIG. 7. The electronic module 101 can include one or more sensor dies 102 mounted on a flexible sensor substrate 103. Thus, in FIG. 8, the sensor substrate 103 can act as the carrier 1, 2, 3 shown in FIGS. 1A-5. While referred to for convenience as a "flexible" substrate 103, it will be understood that in the course of assembly, including adhesion of the substrate 103 to other parts, the substrate may be rendered inflexible. The sensor substrate 103 can be a flexible substrate with integrated bond pads, leads and traces, which allows for a low profile. The sensor substrate 103 can include multiple conductive leads configured to electrically couple to external devices or substrates. In some embodiments, the sensor die 102 can be mechanically and electrically coupled to the sensor substrate 103 by way of a gold thermocompression bond with copper leads. In other embodiments, the sensor die 102 can be soldered to the sensor substrate 103, while in yet other embodiments, the sensor die 102 can be coupled to the sensor substrate 103 using anisotropic conductive film (ACF) or non-conductive paste (NCP) technologies.

Flexible substrates can be useful in arrangements where it is desirable for the substrate to conform to a particular geometry employed within a system. Flexible substrates can be made of a flexible plastic material, such as polyimide or PEEK and can include integrated bond pads, traces and leads similar to those used in conventional PCB substrate technologies. The flexible substrate can be easily bent or folded to conform to a particular geometry, which permits contacting downstream components in a variety of configurations. Furthermore, traces and leads can be patterned on the flexible substrate in very small dimensions. For example, in some embodiments, the traces can have line widths and spaces on the order of about 15 to 20 μm, and the leads or bond pads can have widths or diameters of about 200-300 μm with similar spacing, such that the pitch is on the order of 400-600 μm. By employing small lead pitch, it is possible for the sensor substrate to electrically communicate with a large number of pixels (e.g., corresponding to portions of the PDA), which can advantageously increase the resolution of the imaging device. In one embodiment, each of the four illustrated sensor dies 102 can include 480 pixels electrically coupled to the sensor substrate 103, for a total of 1920 pixels in the 4-sensor array shown in FIG. 7. In other embodiments, each sensor die can include a fewer or a greater number of pixels, including e.g., 512 pixels per sensor die. In yet other embodiments, the line widths and spaces can be much smaller or larger, depending on the desired lead density for a particular arrangement. The dimensions of the electronic modules disclosed herein can vary according to the desired implementation. For example, in some embodiments, the illustrated four-die electronic module can have a total length in a range of about 60 mm to about 100 mm and a width in a range of about 20 mm to about 30 mm. The height or thickness of the electronic modules disclosed herein can be relatively small, e.g., in a range of about 5 mm to about 10 mm in various embodiments.

In some embodiments, the sensor die 102 can comprise an x-ray sensing device, including, e.g., a photodiode array (PDA) or other imaging sensor. As shown in FIG. 8, in x-ray applications, the module 101 may also include a collimator (not shown) and a scintillator 141 for converting the x-rays to visible light. The converted visible light can then be received by the sensor die 102, which can convert the visible light to an electrical signal. Alternatively, the collimator and scintillator can be separately provided over the module within the imaging system. In still other embodiments, the sensor die can include any other suitable device configured to detect signals, including, e.g., MEMS sensors and other electrical and electronic sensors. In the embodiment of FIG. 8, the electronic module 101 includes two sensor dies 102, but in other embodiments, it is possible to only use one, three, four, or greater than four sensor dies.

Returning to FIG. 8, the sensor substrate 103 can be mounted on or coupled to a portion of a stiffener 104. The stiffener 104 can provide structural support for the electronic module 101 and can assist in thermally separating the sensor dies 102 from the processor dies, as described in U.S. Pat. No. 10,340,302, which is incorporated by reference herein. The sensor substrate 103 can be wrapped around the stiffener 104. For example, a bottom segment of the sensor substrate 103 can be folded or wrapped around a first lateral side 104a of the stiffener 104 (see FIGS. 9A-9B). The end of the flexible sensor substrate 103 that is wrapped around the stiffener 104 may electrically couple to a flexible processor substrate, as illustrated and described in U.S. Pat. No. 10,340,302. The stiffener 104 can be made of any suitable material, such as a metal, e.g., zinc or aluminum. In other arrangements, the stiffener 104 can be made of a plastic or ceramic. The stiffener 104 and the sensor substrate 103 can be disposed over a carrier 118 which is configured to support the processor substrate(s).

Further, a connector substrate 105 can extend from the outer surface of the electronic module 101. The connector substrate 105 can electrically couple the processor substrate(s) (not shown) to the external controller (such as the controller 140 of FIG. 6), which may be positioned away from the electronic module 101. The connector substrate 105 may also be made of a flexible material, such as a pigtail connector, and can include embedded metallic traces and conductive contacts configured to electrically connect to the processor substrate(s).

Figure 9A:
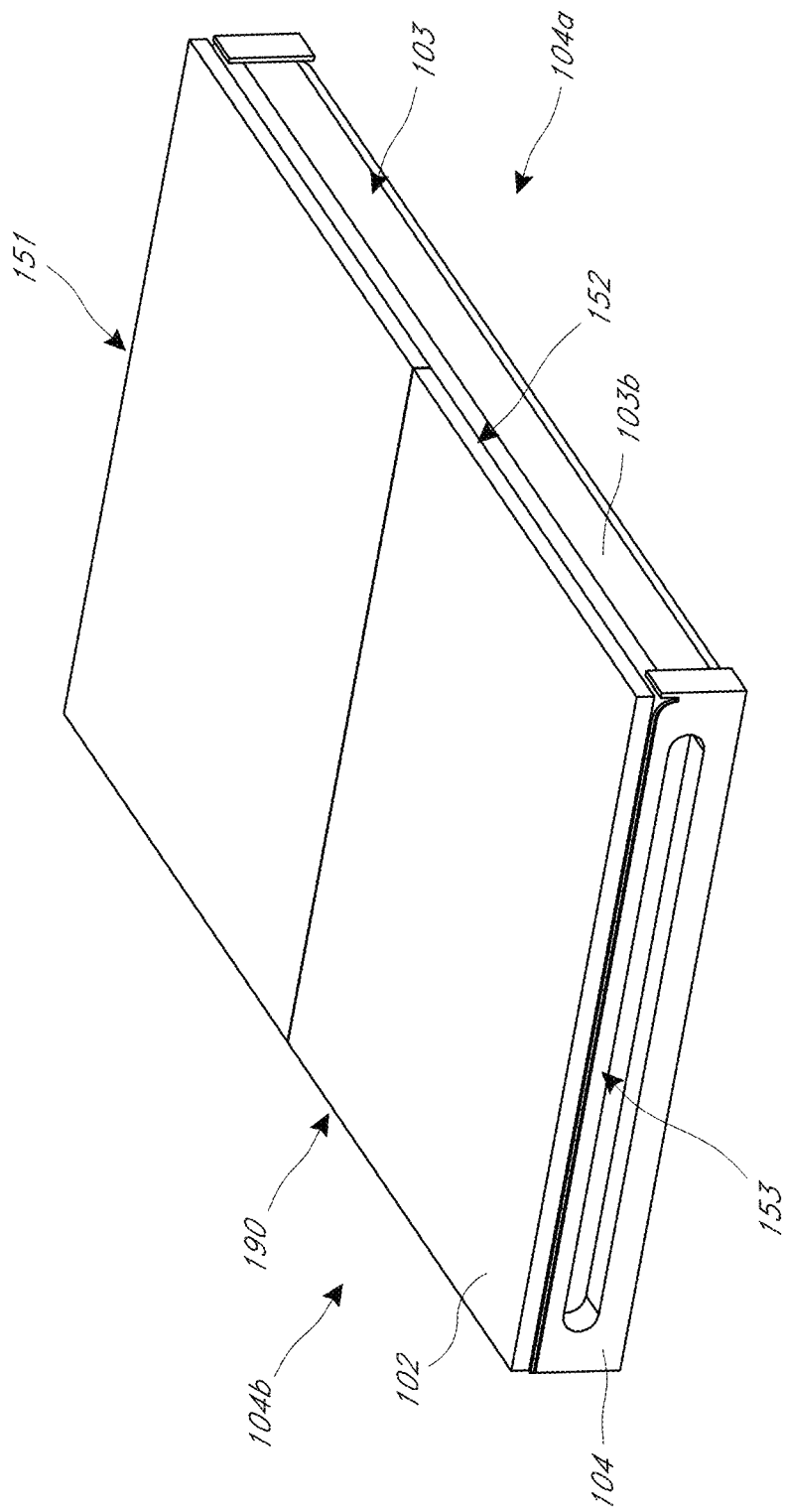
FIG. 9A is a schematic perspective view of a portion of the electronic module that illustrates sensor dies, a sensor substrate, and a stiffener, according to some embodiments.
Figure 9B:
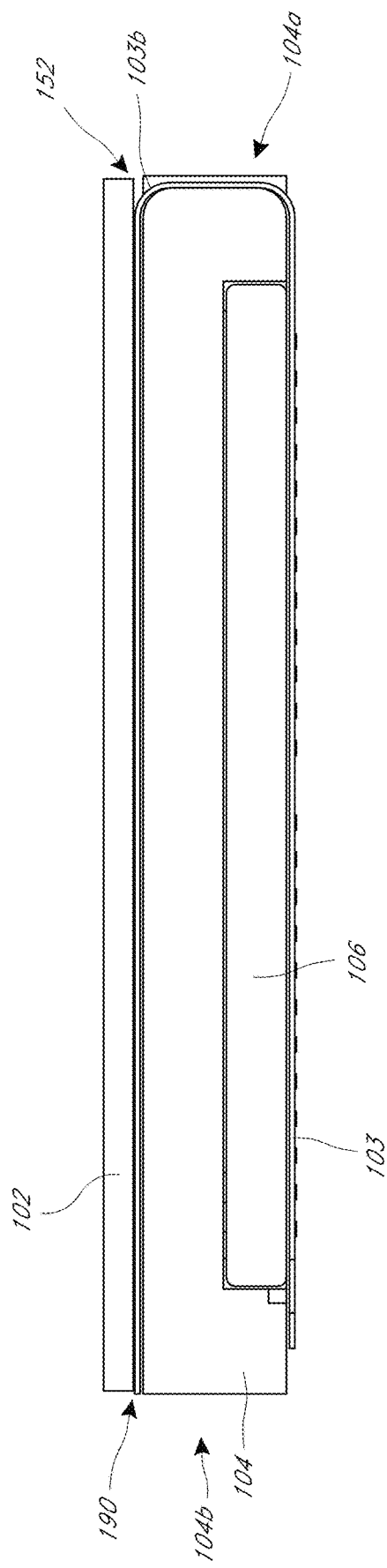
FIG. 9B is a side cross-sectional view of the portion of the electronic module shown in FIG. 9A.

FIG. 9A is a schematic perspective view of a portion of the electronic module 101 that illustrates the sensor dies 102, sensor substrate 103, and stiffener 104, according to some embodiments. FIG. 9B is a side cross-sectional view of the portion of the electronic module 101 shown in FIG. 9A. It can be important to provide a reliable electrical connection between the sensor dies 102 and the sensor substrate 103 while maintaining sufficiently small spacing between adjacent electronic modules 101, such as the adjacent modules 101 in a string 117 (see FIG. 7). In some embodiments, the sensor dies 102 can be soldered to the sensor substrate 103 using a plurality of solder balls (similar to the solder balls 14 of FIGS. 1A, 1C-2D, and 4A-5) or other interconnects. A compound, similar to the compound 16 of FIGS. 1A-1C, and 2D-5 (e.g., an underfill epoxy) can be supplied between the sensor dies 102 and the sensor substrate 103, and can be flowed around the solder balls or interconnects to protect and enhance the reliability of the electrical connections between the dies 102 and the sensor substrate 103. In some arrangements, when the adhesive is flowed between the sensor dies 102 and the substrate 103, the adhesive or epoxy can squeeze out from the edges of the dies 102 and the substrate 103 and can creep upwardly along the sides of the dies 102. Such a positive adhesive edge fillet can extend outwardly relative to the outer perimeter of the electronic module 101. For example, the adhesive can protrude past the perimeter of the sensor dies 102 as seen from a top plan view of the module 101.

In some embodiments, the extension of a positive adhesive fillet beyond the outer perimeter of the electronic module 101 may be undesirable. For example, because surrounding electronic modules and other system components may be positioned adjacent a particular electronic module 101, it can be important to ensure that the positive adhesive fillet does not extend beyond the outer perimeter of the dies 102 or sensor substrate 103. In some arrangements, it can be desirable to ensure that the positive adhesive extends less than 50 microns outside the outer perimeter of the sensor die 102. If the positive epoxy fillet extends too far outside the perimeter of the die 102, then the end user may have difficulty assembling adjacent electronic modules or other components.

Accordingly, in some embodiments, epoxy underfill can be applied between the sensor dies 102 and the sensor substrate 103 such that a negative epoxy edge fillet is created at the edges of the dies 102, as explained above in connection with FIGS. 1A-5. Such a negative fillet can be configured to not extend outside the outer perimeter of the sensor dies 102 (for example, as seen from a top or bottom plan view), which can ensure that adjacent electronic modules may be accurately and reliably placed next to one another. In some embodiments, it may be acceptable for a fillet to extend slightly past the outer perimeter, e.g., by less than 50 microns. For example, as shown in FIG. 9A, the sensor substrate 103 can be wrapped around the first side 104a of the stiffener 104 such that a bend 103b of the substrate 103 is positioned along the first side 104a. The electronic module 101 can include a first edge 152 disposed along the length of the first side 104a of the stiffener 104 and a second edge 190 disposed along the length of a second side 104b of the stiffener 104. As shown in FIGS. 9A and 9B, the first edge 152 can be disposed adjacent the bend 103b of the substrate 103. The electronic module 101 can also include opposing third and fourth edges 151, 153 along the width of the stiffener 104.

The sensor dies 102 can be connected to the sensor substrate 103 using a plurality of interconnects, such as solder balls, and the sensor substrate 103 can be wrapped around the stiffener 104. After wrapping the sensor substrate 103 around the stiffener 104, the underfill epoxy can be dispensed between the sensor dies 102 and the sensor substrate 103 along the second edge 190, e.g., along the edge that is opposite the bend 103b of the substrate 103. Capillary action can help draw the underfill epoxy around the solder balls (or other interconnects) and can pull the adhesive or epoxy to the first edge 152.

Figure 10B:
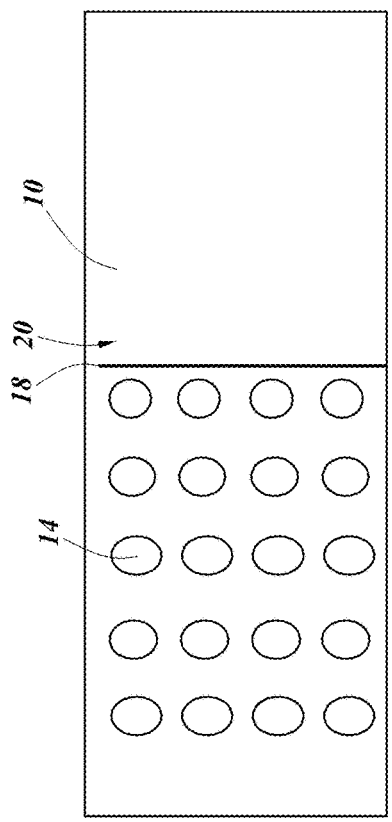
FIG. 10B illustrates another step in a process of mounting an integrated device die on a carrier.
Figure 10D:
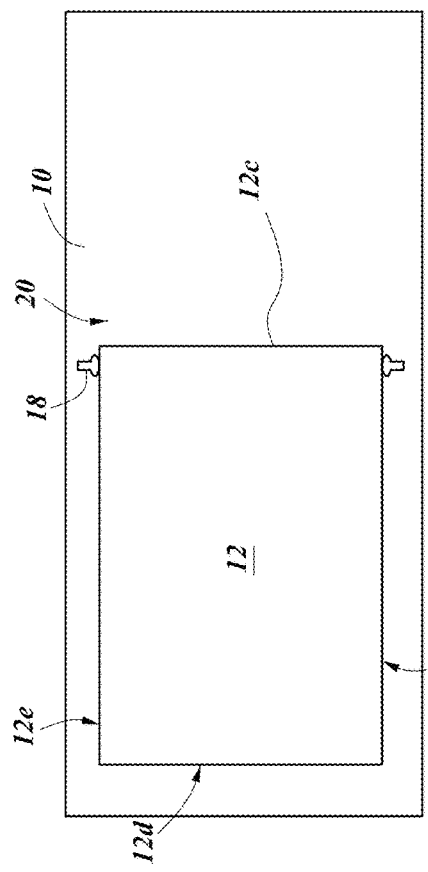
FIG. 10D illustrates another step in a process of mounting an integrated device die on a carrier.
Figure 10A:
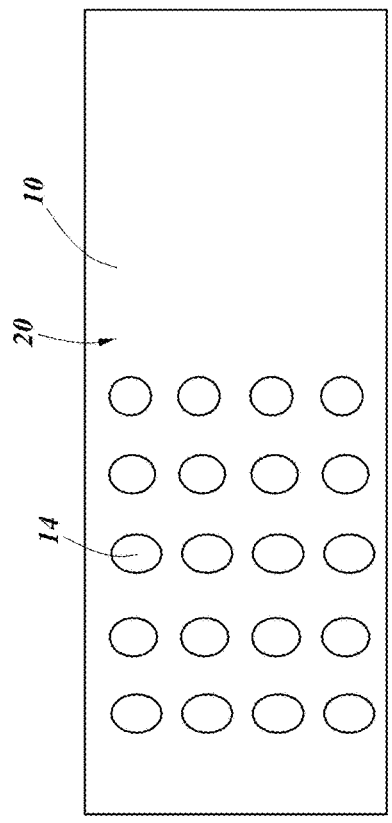
FIG. 10A illustrates a step in a process of mounting an integrated device die on a carrier.

FIGS. 10A-10D illustrates a process of mounting an integrated device die 12 on a carrier 10. FIG. 10A shows a schematic top plan view of the carrier 10. A plurality of solder balls 14 can be provided on the carrier 10. In some embodiments, the plurality of solder balls 14 can be screen printed on the carrier 10. The carrier 10 can comprise any suitable carrier. For example, in some embodiments, the carrier 10 can comprise a package substrate, such as a flexible substrate including a nonconductive material and a plurality of embedded metal traces, a printed circuit board (PCB), a leadframe substrate, a ceramic substrate, etc.

A dam structure 18 can be provided on the carrier 10 in FIG. 10B. The dam structure 18 can be provided on the carrier 10 by any suitable method. For example, in the illustrated embodiment, the dam structure 18 can be provided by way of a stamping and/or blade transfer process. In some embodiments, the stamping process can utilize a pick and place process. In other embodiments, the dam structure 18 can be dispensed on the carrier 10, e.g., dispensed continuously along a length of the dam structure 18. The dam structure 18 can comprise any suitable non-conductive material. In some embodiments, the dam structure 18 can comprise a non-conductive epoxy, such as ALPHA® HiTech™ AD13-9620B manufactured by MacDermid Alpha Electronics Solutions. In some embodiments, the dam structure 18 can be provided in a gel state, which can be cured after the integrated device die 12 is provided on the carrier 10.

In some embodiments, the dam structure 18 provided on the carrier 10 can have a height in a rage from 0.1 mm to 0.2 mm. For example, the height of the dam structure 18 can be in a range of 0.1 mm to 0.17 mm, in a range of, 0.12 mm to 0.17 mm, or about 0.14 mm. In some embodiments, the dam structure can have a width in a range of 0.3 mm to 0.7 mm. For example, the width can be in a range of 0.3 mm to 0.6 mm, in a range of 0.4 mm to 0.7 mm, or about 0.5.

Figure 10C:
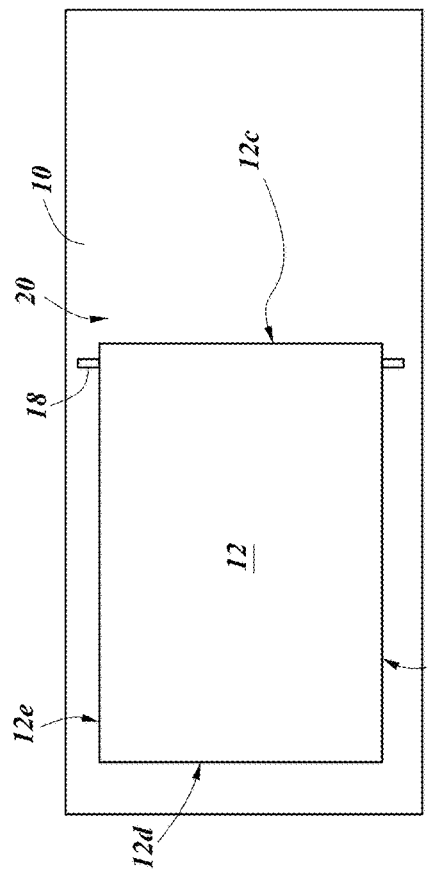
FIG. 10C illustrates another step in a process of mounting an integrated device die on a carrier.

The integrated device die 12 can be provided on the carrier 10 in FIG. 10C. The plurality of solder balls 14 can electrically connect first contact pads (not shown) on a lower surface of the integrated device die 12 with corresponding second contact pads (not shown) on the carrier 10. The plurality of solder balls 14 can be heated to reflow. The dam structure 18 can be heated after the integrated device die 12 is provided to cure the dam structure 18. The dam structure 18 can extend between the carrier 10 and a portion of the lower surface 12b of the integrated device die 12. The integrated device die 12 can have a first outer side edge 12c, a second outer side edge 12d, a third outer side edge 12e, and a fourth outer side edge 12f. As illustrated, the integrated device die 12 can be positioned such that the dam structure 18 is disposed in a region along the first outer side edge 12c.

At FIG. 10D, a dam dot 30 is provided at portions of the dam structure 18. In some embodiments, the dam dot 30 can be a portion of the dam structure 18. In some embodiments, the dam dot 30 and the dam structure 18 can comprise the same material. In some other embodiments the dam dot 30 and the dam structure 18 can comprise different materials. The dam dot 30 can be provided on a portion of the dam structure 18 at the third outer side edge 12e and on a portion of the dam structure 18 at the fourth outer side edge 12f. In some embodiments, the dam dot 30 can be dispensed on the potions of the dam structure 18. In some embodiments, the dam dot can be provided by way of a dipping nozzle. In some embodiments, an upper surface of the integrated device die 12 is free from the dam dot 30. In some embodiments, the dam dot 30 can prevent or mitigate the compound 16 (not illustrated, see, for example, FIG. 2D) from reaching a compound free region 20 of the carrier 10. In some embodiments, the dam structure 18 with the dam dot 30 can further mitigate or prevent the compound 16 from reaching the compound free region 20 of the carrier 10 than without the dam dot 30.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," and words of similar import, when used in this application, shall refer to this application as a whole and not to any particular portions of this application. Where the context permits, words in the above Detailed Description using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. For example, circuit blocks described herein may be deleted, moved, added, subdivided, combined, and/or modified. Each of these circuit blocks may be implemented in a variety of different ways. Thus, it is intended that the scope of the subject matter herein disclosed should not be limited by the particular disclosed embodiments described above, but should be determined by a fair reading of the claims that follow.

What is claimed is:

1. An electronic module comprising:
a package substrate;
an integrated device die having an upper side, a lower side, and an outer side edge;
a dam structure having a first sidewall and a second sidewall opposite the first sidewall, the second sidewall being nearer to the outer side edge than the first sidewall, the first sidewall being laterally positioned between a center of the lower side of the integrated device die and the outer side edge, the dam structure disposed between a portion of the package substrate and a portion of the lower side of the integrated device die; and
a mounting compound disposed between the lower side of the integrated device die and the package substrate, the dam structure positioned between the mounting compound and the outer side edge of the integrated device die,
wherein the dam structure laterally extends generally along a length of the outer side edge and is configured to retain the mounting compound on a first sidewall side of the dam structure.

2. The electronic module of claim 1, wherein the dam structure comprises a non-conductive epoxy.

3. The electronic module of claim 1, wherein the dam structure comprises an hour glass shape.

4. The electronic module of claim 1, wherein the integrated device die comprises a sensor die.

5. The electronic module of claim 1, wherein the package substrate comprises a flexible substrate.

6. The electronic module of claim 1, further comprising a stiffener configured to provide mechanical support for the package substrate.

7. The electronic module of claim 6, wherein the package substrate wraps around the stiffener.

8. The electronic module of claim 7, further comprising an electronic component mounted on the package substrate such that the stiffener in positioned between the integrated device die and the electronic component.

9. The electronic module of claim 1, wherein the dam structure comprises a dam dot at a second outer side edge different from the outer side edge, the dam dot having a thickness greater than a thickness of a portion of the dam structure disposed between the package substrate and the integrated device die.

10. An electronic module comprising:
a substrate;
an integrated device die mounted to the substrate, the integrated device die having an upper side, a lower side opposite the upper side, a first outer side edge region, and a second outer side edge region laterally opposite the first outer side edge region;
a mounting compound comprising a first portion disposed between at least a portion of the lower side of the of the integrated device die and the substrate; and
a dam structure disposed along the first outer side edge region and disposed between the substrate and the lower side of the integrated device die, the dam structure having a first sidewall and a second sidewall opposite the first sidewall, the first sidewall facing the mounting compound and the second sidewall facing away from the mounting compound, the first sidewall and the second sidewall positioned under the first outer side edge region.

11. The electronic module of claim 10, wherein the dam structure comprises a non-conductive epoxy.

12. The electronic module of claim 10, wherein the dam structure is inset from the outer side edge.

13. The electronic module of claim 10, wherein the integrated device die comprises a sensor die.

14. The electronic module of claim 10, wherein the substrate comprises a flexible substrate.

15. The electronic module of claim 10, further comprising a stiffener configured to provide mechanical support for the substrate.

16. An electronic module comprising:
a substrate having a die mount portion and a bent portion bent relative to the die mount portion;
an integrated device die mounted to the die mount portion of the substrate, the integrated device die having an upper side, a lower side opposite the upper side, a first outer side edge, and a second outer side edge;

a mounting compound disposed between the integrated device die and the die mount portion of the substrate;

a dam structure disposed between a portion of the die mount portion of the substrate and a portion of the lower side of the integrated device die, the dam structure configured to prevent overflow of the mounting compound, the dam structure comprises a first sidewall facing the mounting compound and a second sidewall opposite the first sidewall, the second sidewall positioned between the first outer side edge and the first sidewall, and the first sidewall positioned closer to the first outer side edge than to the second outer side edge, wherein at least a portion of the dam structure is positioned outside of a perimeter of the integrated device die.

17. The electronic module of claim 16, wherein the dam structure comprises a non-conductive epoxy.

18. The electronic module of claim 16, wherein the substrate comprises a flexible substrate.

19. The electronic module of claim 16, further comprising a stiffener configured to provide mechanical support for the substrate.

20. The electronic module of claim 16, wherein the first sidewall and the second sidewall of the dam structure are positioned under a first outer side edge region of the integrated device die.

* * * * *

UNITED STATES PATENT AND TRADEMARK OFFICE
CERTIFICATE OF CORRECTION

PATENT NO. : 11,664,340 B2
APPLICATION NO. : 16/927853
DATED : May 30, 2023
INVENTOR(S) : Venkatadri et al.

It is certified that error appears in the above-identified patent and that said Letters Patent is hereby corrected as shown below:

In the Specification

In Column 2, Line 37, before "integrated" delete "of the".

In Column 4, Line 44, delete "an or" and insert -- and/or --.

In the Claims

In Claim 10, Column 18, Line 41, delete "of the of the" and insert -- of the --.

Signed and Sealed this
Twelfth Day of September, 2023

Katherine Kelly Vidal
*Director of the United States Patent and Trademark Office*